US011957033B2

(12) United States Patent
Yang et al.

(10) Patent No.: US 11,957,033 B2
(45) Date of Patent: Apr. 9, 2024

(54) DISPLAY PANEL, MANUFACTURING METHOD THEREOF, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Huijuan Yang, Beijing (CN); Tingliang Liu, Beijing (CN); Tinghua Shang, Beijing (CN); Yang Zhou, Beijing (CN); Pengfei Yu, Beijing (CN); Yi Zhang, Beijing (CN); Junxi Wang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 498 days.

(21) Appl. No.: 17/280,130

(22) PCT Filed: May 9, 2020

(86) PCT No.: PCT/CN2020/089361
§ 371 (c)(1),
(2) Date: Mar. 25, 2021

(87) PCT Pub. No.: WO2021/226743
PCT Pub. Date: Nov. 18, 2021

(65) Prior Publication Data
US 2022/0115465 A1 Apr. 14, 2022

(51) Int. Cl.
*H10K 59/88* (2023.01)
*H01L 23/544* (2006.01)
(Continued)

(52) U.S. Cl.
CPC ............ *H10K 59/88* (2023.02); *H01L 23/544* (2013.01); *H10K 59/131* (2023.02); *H10K 71/00* (2023.02);
(Continued)

(58) Field of Classification Search
CPC ............ H01L 2223/544–54486; H10K 59/131; G02F 1/133354; G02F 1/1345–13458
See application file for complete search history.

(56) References Cited

U.S. PATENT DOCUMENTS

2006/0290874 A1    12/2006  Yoon et al.
2018/0337220 A1*  11/2018  Kim ................. H10K 59/12
(Continued)

FOREIGN PATENT DOCUMENTS

CN       1888958 A      1/2007
CN     205507294 U      8/2016
(Continued)

OTHER PUBLICATIONS

Extended European Search Report for Application No. 20922490.6-1020, dated May 8, 2023, 7 Pages.

*Primary Examiner* — Daniel P Shook
(74) *Attorney, Agent, or Firm* — BROOKS KUSHMAN P.C.

(57) ABSTRACT

Provided are a display panel, a manufacturing method thereof, and a display device. The display panel includes an alignment mark region arranged within a flat region of a peripheral region of the display panel. The peripheral region is a region of the display panel other than an active area of the display panel. An alignment mark pattern is arranged within the alignment mark region, and/or at least one film layer within the alignment mark region is hollowed out.

18 Claims, 11 Drawing Sheets

(51) Int. Cl.
*H10K 59/131* (2023.01)
*H10K 71/00* (2023.01)
*H10K 59/12* (2023.01)

(52) U.S. Cl.
CPC .............. *H01L 2223/54426* (2013.01); *H10K 59/1201* (2023.02)

(56) References Cited

U.S. PATENT DOCUMENTS

| | | |
|---|---|---|
| 2019/0072790 A1 | 3/2019 | Maeda et al. |
| 2020/0035762 A1 | 1/2020 | Kim et al. |

FOREIGN PATENT DOCUMENTS

| | | |
|---|---|---|
| CN | 107505816 A | 12/2017 |
| CN | 107797316 A | 3/2018 |
| CN | 109427661 A | 3/2019 |
| CN | 109742054 A | 5/2019 |
| CN | 110571254 A | 12/2019 |
| CN | 110703479 A | 1/2020 |
| CN | 111679757 A | 9/2020 |
| JP | H11354415 A | 12/1999 |

\* cited by examiner

DISPLAY PANEL, MANUFACTURING METHOD THEREOF, AND DISPLAY DEVICE

CROSS-REFERENCE TO RELATED APPLICATION

This application is the U.S. national phase of PCT Application No. PCT/CN2020/089361 filed on May 9, 2020, which is incorporated herein by reference in its entirety.

TECHNICAL FIELD

The present disclosure relates to the field of display technology, in particular to a display panel, a manufacturing method thereof, and a display device.

BACKGROUND

Along with the increasing demand on display devices, the quantity of circuitries and lines in a display panel increase too, so a pad bending technique is adopted for an upper bezel or a lower bezel of the display panel. For the pad bending technique, a part of a circuit board (which may be a flexible circuit board) of the display device is folded toward a back surface of the display panel, and a heat dissipation film is attached to a surface of the circuit board folded to the back surface of the display panel, so as to reduce heat generated during the operation of the circuits. In order to increase alignment accuracy for folding and attachment accuracy for the heat dissipation film, it is necessary to identify an alignment mark in the display panel to perform alignment. In the related art, in the case of not increasing a width of the bezel, there is no technical scheme for implementing the alignment mark accurately for a four-surface-folding display panel.

SUMMARY

A main object of the present disclosure is to provide a display panel, a manufacturing method thereof, and a display device.

In one aspect, the present disclosure provides in some embodiments a display panel, including an alignment mark region arranged within a flat region of a peripheral region of the display panel,
wherein the peripheral region is a region of the display panel other than an active area of the display panel; and
an alignment mark pattern is arranged within the alignment mark region, and/or at least one film layer within the alignment mark region is hollowed out.

In a possible embodiment of the present disclosure, the film layer includes a metal layer.

In a possible embodiment of the present disclosure, the display panel is provided with a flat surface at the flat region.

In a possible embodiment of the present disclosure, the display panel includes an upper surface, a lower surface, a first side surface, a second side surface, a third side surface and a fourth side surface;
the first side surface, the second side surface, the third side surface and the fourth side surface are curved side surfaces;
an orthogonal projection of the first side surface onto a first plane does not overlap an orthogonal projection of the flat region onto the first plane;
an orthogonal projection of the second side surface onto the first plane does not overlap the orthogonal projection of the flat region onto the first plane;
an orthogonal projection of the third side surface onto the first plane does not overlap the orthogonal projection of the flat region onto the first plane;
an orthogonal projection of the fourth side surface onto the first plane does not overlap the orthogonal projection of the flat region onto the first plane;
the first plane is parallel to the lower surface.

In a possible embodiment of the present disclosure, an edge of an orthogonal projection of the alignment mark region onto the base is a polygonal edge, an L-shaped edge or a T-shaped edge, and an orthogonal projection of the alignment mark pattern onto the base is an L-shaped projection, a T-shaped projection, or a polygonal projection.

In a possible embodiment of the present disclosure, the flat region includes a flat fan-out region; and the alignment mark region is included in the flat fan-out region;
within the flat fan-out region, the display panel includes a first metal layer arranged on a base;
within the alignment mark region, the first metal layer is hollowed out;
within the flat fan-out region, the first metal layer includes a first metal pattern surrounding the alignment mark region.

In a possible embodiment of the present disclosure, the first metal pattern includes a connection line between a data line and a source driver.

In a possible embodiment of the present disclosure, the first metal pattern includes a direct current voltage signal line.

In a possible embodiment of the present disclosure, within the flat fan-out region, the display panel further includes a semiconductor layer arranged between the base and the first metal layer;
the semiconductor layer is hollowed out at a region of the flat fan-out region other than the alignment mark region;
within the alignment mark region, the semiconductor layer includes an alignment mark pattern.

In a possible embodiment of the present disclosure, within the alignment mark region, the display panel further includes an anode layer arranged at a surface of the first metal layer distal to the base;
within the alignment mark region, the anode layer is not provided with an opening;
within a region other than the alignment mark region, the anode layer is provided with a plurality of openings arranged at intervals.

In a possible embodiment of the present disclosure, the flat region includes a flat signal line region, the alignment mark region is included in the flat signal line region;
within the alignment mark region, the display panel includes a semiconductor layer arranged on the base;
the semiconductor layer includes the alignment mark pattern.

In a possible embodiment of the present disclosure, the flat region includes a flat signal line region, the alignment mark region is included in the flat signal line region;
within the flat signal line region, the display panel includes a second metal layer arranged on the base;
the second metal layer is hollowed out at the alignment mark region.

In a possible embodiment of the present disclosure, the second metal layer includes a signal line.

In another aspect, the present disclosure provides in some embodiments a method for manufacturing a display panel, including: providing an alignment mark region within a flat region of a peripheral region of the display panel, wherein an alignment mark pattern is arranged within the alignment mark region, and/or at least one film layer at the alignment mark region is hollowed out;

the peripheral region is a region of the display panel other than an active area of the display panel.

In a possible embodiment of the present disclosure, the film layer includes a metal layer.

In a possible embodiment of the present disclosure, the display panel is provided with a flat surface at the flat region.

In a possible embodiment of the present disclosure, the display panel includes an upper surface, a lower surface, a first side surface, a second side surface, a third side surface and a fourth side surface;

the first side surface, the second side surface, the third side surface and the fourth side surface are curved side surfaces;

an orthogonal projection of the first side surface onto a first plane does not overlap an orthogonal projection of the flat region onto the first plane;

an orthogonal projection of the second side surface onto the first plane does not overlap the orthogonal projection of the flat region onto the first plane;

an orthogonal projection of the third side surface onto the first plane does not overlap the orthogonal projection of the flat region onto the first plane;

an orthogonal projection of the fourth side surface onto the first plane does not overlap the orthogonal projection of the flat region onto the first plane;

the first plane is parallel to the lower surface.

In a possible embodiment of the present disclosure, the flat region includes a flat fan-out region, and the alignment mark region is included in the flat fan-out region;

the providing the alignment mark region within the flat region of the peripheral region of the display panel includes: within the flat fan-out region, forming a first metal layer on a surface of the base; patterning the first metal layer to form a first metal pattern, and enabling the first metal layer at the alignment mark region to be hollowed out, wherein the first metal pattern surrounds the alignment mark region.

In a possible embodiment of the present disclosure, the flat region includes a flat fan-out region, and the alignment mark region is included in the flat fan-out region;

the providing the alignment mark region within the flat region of the peripheral region of the display panel includes: within the flat fan-out region, forming a semiconductor layer on a base, and patterning the semiconductor layer to enable the semiconductor layer to be hollowed out at a region of the flat fan-out region other than the alignment mark region;

forming a first metal layer at a surface of the semiconductor layer distal to the base, and patterning the first metal layer to form a first metal pattern and enable the first metal layer at the alignment mark region to be hollowed out, wherein the first metal pattern surrounds the alignment mark region.

In a possible embodiment of the present disclosure, the flat region includes a flat signal line region, and the alignment mark region is included in the flat signal line region;

the providing the alignment mark region within the flat region of the peripheral region of the display panel includes: within the flat signal line region, forming a semiconductor layer on the base, and patterning the semiconductor layer to form an alignment mark pattern, wherein the alignment mark pattern is arranged at the alignment mark region.

In a possible embodiment of the present disclosure, the flat region includes a flat signal line region, and the alignment mark region is included in the flat signal line region;

the providing the alignment mark region within the flat region of the peripheral region of the display panel includes: within the flat signal line region, forming a second metal layer on a surface of the base, and enabling the second metal layer to be hollowed out at the alignment mark region.

In a possible embodiment of the present disclosure, the method further includes patterning the second metal layer to form a signal line.

In yet another aspect, the present disclosure provides in some embodiments a display device including the above-mentioned display panel.

DETAILED DESCRIPTION

The present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Along with the increasing demand on display devices, the quantity of circuitries and lines in a display panel increase too, so a pad bending technique is adopted for an upper bezel or a lower bezel of the display panel. For the pad bending technique, a part of a circuit board (which may be a flexible circuit board) of the display device is folded toward a back surface of the display panel, and a heat dissipation film is attached to a surface of the circuit board folded to the back surface of the display panel, so as to reduce heat generated during the operation of the circuits. In order to increase alignment accuracy for folding and attachment accuracy for the heat dissipation film, it is necessary to identify alignment marks in the display panel to implement an alignment. During the implementation, the alignment marks may include an alignment mark for folding the circuit board and/or an alignment mark for attaching the heat dissipation film. The alignment marks may be identified by an alignment camera, so as to determine positions. Definition of an image identified by the alignment camera through focusing is associated with consistency of object distances, so the alignment marks need to be placed at a flat region where the display panel is provided with a flat surface.

When the display panel is a four-surface-folding display panel, an upper surface and a lower surface of the display panel are each a flat surface, and an upper side surface of the display panel, a lower side surface of the display panel, a left side surface of the display panel and a right side surface of the display panel are each a curved side surface, so a size of the flat region is relatively small.

Figure 1A:
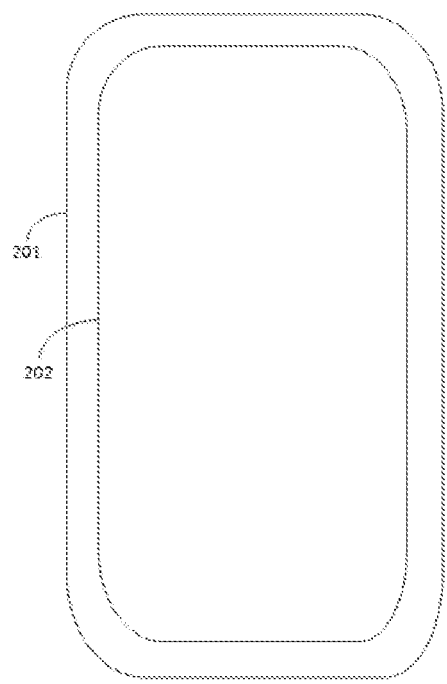
FIGS. 1A, 1B and 1C are top views of a four-surface-folding display panel, after a circuit board has been folded and before the four side surfaces of the four-surface-folding display panel have been folded.
Figure 1B:
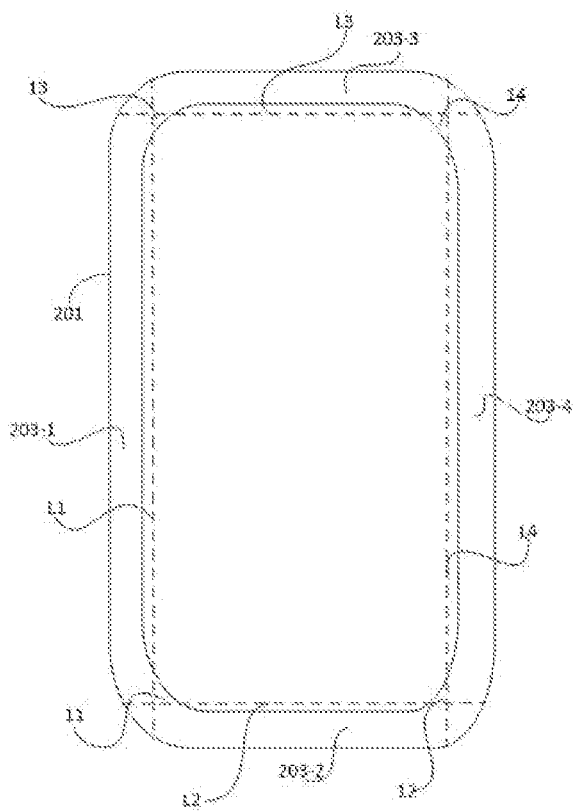

FIGS. 1A and 1B are top views of a four-surface-folding display panel, after a circuit board has been folded and before the four side surfaces of the four-surface-folding display panel have been folded.

In FIG. 1A, the sign 201 represents an outer edge of the display panel, and the sign 202 represents an active area boundary which surrounds an Active Area (AA) of the display panel. A peripheral region of the display panel is a region of the display panel other than the active area.

In FIG. 1B, the sign 201 represents the outer edge of the display panel, the sign 203-1 represents a left curved region of the display panel, the sign 203-2 represents a lower curved region of the display panel, the sign 203-3 represents an upper curved region of the display panel, and the sign 203-4 represents a right curved region of the display panel.

In FIG. 1B, the sign L1 represents a first dashed line, and a region on the left of the display panel surrounded by the first dashed line L1 and the outer edge of the display panel is the left curved region 203-1 of the display panel. The sign L2 represents a second dashed line, and a region at a lower side of the display panel surrounded by the second dashed line L2 and the outer edge of the display panel is the lower curved region 203-2 of the display panel. The sign L3 represents a third dashed line, and a region at an upper side of the display panel surrounded by the third dashed line L3 and the outer edge of the display panel is the upper curved region 203-3 of the display panel. The sign L4 represents a fourth dashed line, and a region on the right of the display panel surrounded by the fourth dashed line L4 and the outer edge of the display panel is the right curved region 203-4 of the display panel. A flat region in the peripheral region of the display panel may be a region in the peripheral region of the display panel not covered by the right curved region 203-1, the lower curved region 203-2, the upper curved region 203-3 and the right curved region 203-4.

In FIG. 1B, the sign 11 represents a first flat region included in the flat region of the display panel, the sign 12 represents a second flat region included in the flat region of the display panel, the sign 13 represents a third flat region included in the flat region of the display panel, and the sign 14 represents a fourth flat region included in the flat region of the display panel. In other words, in the four-side-folding display panel whose four side surfaces are folded, the flat region may be located at an upper left side, a lower left side, an upper right side and a lower right side in proximity to the active area.

In FIG. 1B, the first flat region 11 is a flat region located at a lower left side of the display panel, the second flat region 12 is a flat region located at a lower right side of the display panel, the third flat region 13 is a flat region located at an upper left side of the display panel, and the forth flat region 14 is a flat region located at an upper right side of the display panel.

The first flat region 11 is arranged proximate to a lower left rounded corner of the active area boundary 202, the second flat region 12 is arranged proximate to a lower right rounded corner of the active area boundary 202, the third flat region 13 is arranged proximate to an upper left rounded corner of the active area boundary 202, and the fourth flat region 14 is arranged proximate to an upper right rounded corner of the active area boundary 202.

In at least one embodiment of the present disclosure, an orthogonal projection of the left side surface of the display panel onto a first plane may overlap an orthogonal projection of the left curved region 203-1 onto the first plane, an orthogonal projection of the lower side surface of the display panel onto the first plane may overlap an orthogonal projection of the lower curved region 203-2 onto the first plane, an orthogonal projection of the upper side surface of the display panel onto the first plane may overlap an orthogonal projection of the upper curved region 203-3 onto the first plane, and an orthogonal projection of the right side surface of the display panel onto the first plane may overlap an orthogonal projection of the right curved region 203-4 onto the first plane. The first plane may be parallel to the lower surface of the display panel.

Figure 1C:
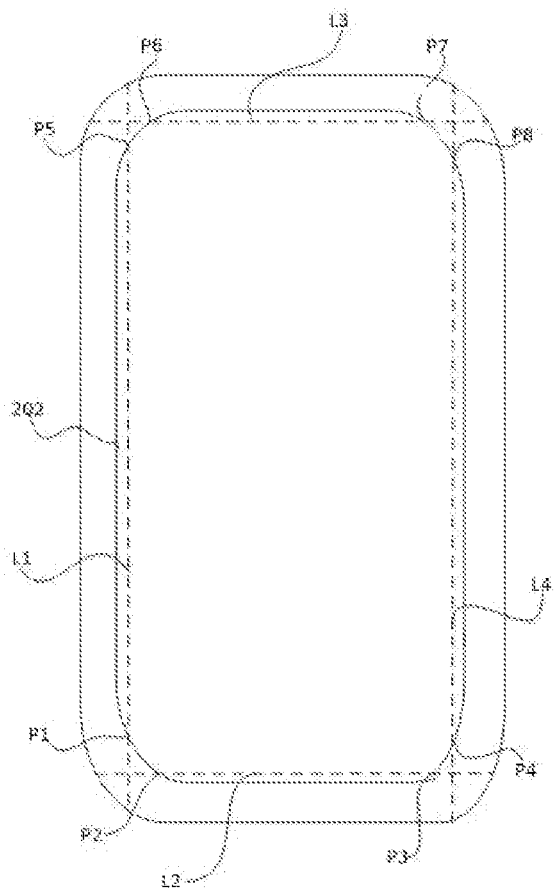

As shown in FIG. 1C, the lower left corner of the active area boundary 202 may be a portion between a first intersection point P1 and a second intersection point P2 on the active area boundary 202. The first intersection point P1 may be a point where the first dashed line L1 intersects a lower left portion of the active area boundary 202, and the second intersection point P2 may be a point where the second dashed line L2 intersects the lower left portion of the active area boundary 202.

As shown in FIG. 1C, the lower right rounded corner of the active area boundary 202 may be a portion between a third intersection point P3 and a fourth intersection point P4 on the active area boundary 202. The third intersection point P3 may be a point where the second dashed line L2 intersects a lower right portion of the active area boundary 202, and the fourth intersection point P4 may be a point where the fourth dashed line L4 intersects the lower left portion of the active area boundary 202.

As shown in FIG. 1C, the upper left rounded corner of the active area boundary 202 may be a portion between a fifth intersection point P5 and a sixth intersection point P6 on the active area boundary 202. The fifth intersection point P5 may be a point where the first dashed line L1 intersects an upper left portion of the active area boundary 202, and the sixth intersection point P6 may be a point where the third dashed line L3 intersects the upper left portion of the active area boundary 202.

As shown in FIG. 1C, the upper right rounded corner of the active area boundary 202 may be a portion between a seventh intersection point P7 and an eighth intersection point P8 on the active area boundary 202. The seventh intersection point P7 may be a point where the third dashed line L3 intersects an upper right portion of the active area boundary 202, and the eighth intersection point P8 may be a point where the fourth dashed line L4 intersects the upper left portion of the active area boundary 202.

Figure 2:
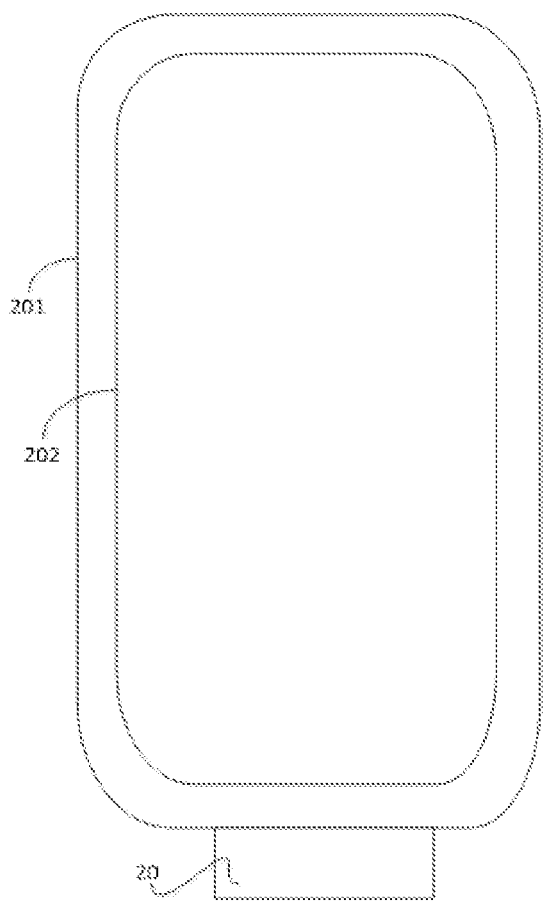
FIG. 2 is a top view of the four-surface-folding display panel before the circuit board has been folded.

FIG. 2 is a top view of the four-surface-folding display panel before a circuit board has been folded. In FIG. 2, the sign 20 represents the circuit board. The circuit board 20 may be a flexible circuit board. During the manufacture of the four-surface-folding display panel, it is necessary to fold the circuit board 20 to a back surface of the display panel.

In the embodiments of the present disclosure, when the circuit board 20 is folded to the back surface of the display panel, a heat dissipation film may be attached to each of the back surface and the four side surfaces of the display panel for heat dissipation.

In at least one embodiment of the present disclosure, when the circuit board 20 is arranged at a lower side of the display panel and it is necessary to fold the circuit board 20 to the back surface of the display panel, alignment marks may be arranged at the first flat region 11 and/or the second flat region 12, so as to perform the alignment for the folding and the alignment for the attachment of the heat dissipation film. Moreover, when the circuit board 20 is arranged at the lower side of the display panel, because the heat dissipation film also needs to be attached to the upper side surface of the display panel, the alignment marks may also be arranged at the third flat region 13 and/or the fourth flat region 14, so as to perform the alignment for the attachment of the heat dissipation film.

During the implementation, when the circuit board 20 is arranged at the lower side of the display panel, an alignment mark for folding may also be arranged on the circuit board. The alignment for folding may be performed in accordance with the alignment mark for folding on the circuit board in conjunction with the alignment marks at the first flat region 11 and/or the second flat region 12.

In at least one embodiment of the present disclosure, when the circuit board 20 is arranged at an upper side of the display panel and it is necessary to fold the circuit board 20 to the back surface of the display panel, the alignment marks may be arranged at the third flat region 13 and/or the fourth flat region 14, so as to perform the alignment for folding and the alignment for the attachment of the heat dissipation film. Moreover, when the circuit board 20 is arranged at the upper side of the display panel, because the heat dissipation film also needs to be attached to the lower side surface of the display panel, the alignment marks may also be arranged at the first flat region 11 and/or the second flat region 12, so as to perform the alignment for the attachment of the heat dissipation film.

During the implementation, when the circuit board 20 is arranged at the upper side of the display panel, an alignment mark for folding may also be arranged on the circuit board. The alignment for folding may be performed in accordance with the alignment mark for folding on the circuit board in conjunction with the alignment marks at the third flat region 13 and/or the fourth flat region 14.

A fan-out region, a driving circuitry region and a signal line region may be arranged sequentially at the peripheral region of the display panel in a direction away from the active area. The fan-out region is a region where a connection line between a source driver and a data line in the active area is located, and a direct current voltage signal line may be arranged in the fan-out region.

The direct current voltage signal line may include a high voltage signal line and/or a low voltage signal line. The high voltage signal line may be used to provide a high voltage signal VDD, and the low voltage signal line may be used to provide a low voltage signal VSS.

A connection line between a gate line and a gate driver may also be arranged in the fan-out region. A signal line may be arranged within the signal line region, and it may include a direct current voltage signal line. When the signal line includes the direct current voltage signal line, the signal line may include a high voltage signal line and/or a low voltage signal line. The low voltage signal line may be used to provide a low voltage signal VSS, and the high voltage signal line may be used to provide a high voltage signal VDD.

The driving circuitry region may include a driving circuitry region and a dummy driving circuitry region. A driving circuitry including a plurality of levels of shift register units may be arranged within the driving circuitry region. The driving circuitry may include a gate driving circuitry for providing a gate driving signal to a plurality of rows of pixel circuitries in the active area.

In a possible embodiment of the present disclosure, the driving circuitry may also include a light-emission control circuitry for providing a respective light-emission control signal to each of the plurality of rows of pixel circuitries in the active area.

A dummy driving circuitry may be arranged within the dummy driving circuitry region, and it may include at least one level of dummy shift register unit. The dummy shift register unit may not be coupled to the pixel circuitries in the active area, and it may be reserved merely to ensure etching uniformity and layout reasonability. A signal line in the dummy shift register unit may receive a signal at a fixed voltage, so as to reduce the influence on the driving circuitry at the driving circuitry region caused by signal jump.

In at least one embodiment of the present disclosure, a first metal layer and an anode layer may be sequentially arranged on a base at the fan-out region. The connection line between the data line and the source driver may be arranged on the first metal layer. In addition, the anode layer may also be provided with a plurality of openings at a region of the fan-out region other than an alignment mark region, and each opening may be provided for gas release of an organic film layer.

During the implementation, the first metal layer may include a gate metal layer and/or a source/drain metal layer.

The gate metal layer may include, but not limited to, a first gate metal layer and a second gate metal layer.

Within the fan-out region, the connection line between the data line and the source driver may be arranged on the first gate metal layer and/or the second gate metal layer, or on the source/drain metal layer.

Within the fan-out region, the connection line between the gate line and the gate driver may be arranged on the first gate metal layer and/or the second gate metal layer, or on the source/drain metal layer.

Within the fan-out region, the direct current voltage signal line may be arranged on the first gate metal layer and/or the second gate metal layer, or on the source/drain metal layer.

In at least one embodiment of the present disclosure, a semiconductor layer, a second metal layer and the anode layer may be arranged sequentially on the base within the signal line region. When the anode layer is arranged on the second metal layer within the signal line region, it is able for a cathode of a light-emitting element at the active area to be lapped onto the low voltage signal line (an area of the anode layer covering the second metal layer is determined by a lapping condition of the low voltage signal line and the cathode).

In a possible embodiment of the present disclosure, the second metal layer may include, but not limited to, a source/drain metal layer and/or a gate metal layer.

During the implementation, the second metal layer may include a signal line, and the signal line may be a direct current voltage signal line. When the signal line includes the direct current voltage signal line, the signal line may include a high voltage signal line and/or a low voltage signal line. The low voltage signal line may be used to provide a low voltage signal VSS, and the high voltage signal line may be used to provide a high voltage signal VDD.

In addition, the anode layer may be provided with a plurality of openings at a region of the signal line region other than the alignment mark region for gas release of an organic film layer.

Figure 3:
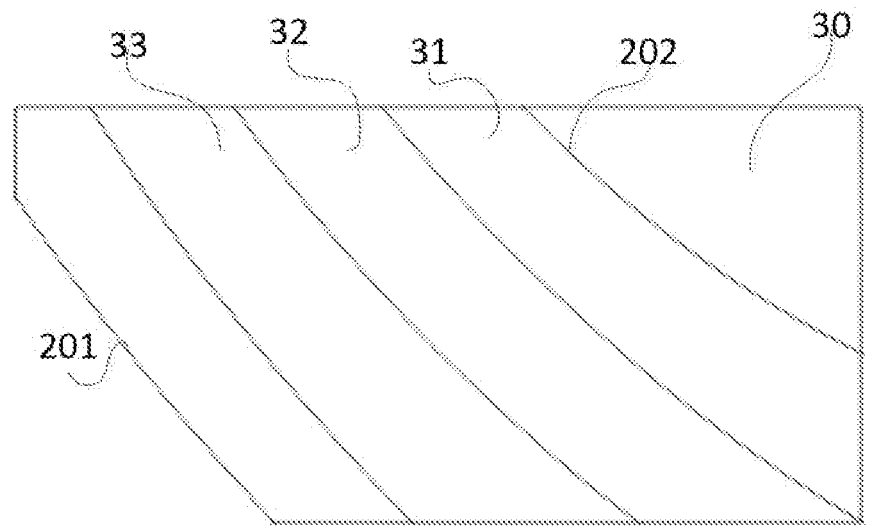
FIG. 3 is a schematic view showing the division of regions at a lower left rounded corner of the display panel in FIG. 1B.

FIG. 3 is a schematic view showing the division of regions at the lower left rounded corner of the display panel in FIG. 1B. In FIG. 3, the sign 30 represents the active area, the sign 31 represents fan-out region, the sign 32 represents the driving circuitry region, the sign 33 represents the signal line region, the sign 201 represents the outer edge of the display panel, and the sign 202 represents the active area boundary.

In at least one embodiment of the present disclosure, the flat region may include a part of the fan-out region, and/or a part of the signal line region. When the flat region includes a part of the fan-out region, the part of the fan-out region may be flat, and when the flat region includes a part of the signal line region, the part of the signal line region may be flat.

During the implementation, a signal line having a certain width may be arranged at the flat signal line region, and a direct current voltage signal may be applied to the signal line. The direct current voltage signal may be a high voltage signal or a low voltage signal.

When the signal line has a certain width, it is able to reduce a resistance of the signal line, thereby to reduce a voltage drop of the direct current voltage signal across the signal line. In a possible embodiment of the present disclosure, the flat region may further include at least a part of the dummy driving circuitry region. When the flat region includes at least a part of the dummy driving circuitry region, the at least a part of the dummy driving circuitry region may be a flat dummy driving circuitry region.

The display panel in at least one embodiment of the present disclosure may include an alignment mark region arranged within a flat region of a peripheral region of the display panel. The peripheral region may be a region of the display panel other than an active area. An alignment mark pattern may be arranged at the alignment mark region, and/or at least one film layer at the alignment mark region may be hollowed out.

According to the embodiments of the present disclosure, the display panel may include the alignment mark region, and the alignment mark pattern may be arranged at the alignment mark region or at least one film layer within the alignment mark region may be hollowed out. Because at least one film layer within the alignment mark region is hollowed out, light transmittance at the alignment mark region may be greater than that at the peripheral region. As a result, it is able to perform the alignment accurately.

In at least one embodiment of the present disclosure, the peripheral region may be a region proximate to the alignment mark region.

In at least one embodiment of the present disclosure, the film layer may be, but not limited to, a metal layer.

During the implementation, the display panel may be provided with a flat surface at the flat region.

In a possible embodiment of the present disclosure, the display panel may include an upper surface, a lower surface, a first side surface, a second side surface, a third side surface and a fourth side surface. The first side surface, the second side surface, the third side surface and the fourth side surface may be curved side surfaces, an orthogonal projection of the first side surface onto a first plane may not overlap an orthogonal projection of the flat region onto the first plane, an orthogonal projection of the second side surface onto the first plane may not overlap the orthogonal projection of the flat region onto the first plane, an orthogonal projection of the third side surface onto the first plane may not overlap the orthogonal projection of the flat region onto the first plane, an orthogonal projection of the fourth side surface onto the first plane may not overlap the orthogonal projection of the flat region onto the first plane, and the first plane may be parallel to the lower surface.

In at least one embodiment of the present disclosure, the display panel may be a four-side-folding display panel. FIG. 1B is a top view of the four-side-folding display panel. The first side surface may be, but not limited to, the left side surface in FIG. 1B, the second side surface may be, but not limited to, the lower side surface in FIG. 1B, the third side surface may be, but not limited to, the upper side surface in FIG. 1B, and the fourth side surface may be, but not limited to, the right side surface in FIG. 1B.

In a possible embodiment of the present disclosure, the first side surface may be the left side surface, the second side surface may be the lower side surface, the third side surface may be the upper side surface, and the fourth side surface may be the right side surface. The display panel may further include a circuit board arranged at the lower surface and at the lower side of the display panel. A maximum distance between an orthogonal projection of the alignment mark region onto the first plane and a lower left rounded corner of an orthogonal projection of an active area boundary of the display panel onto the first plane may be smaller than a predetermined distance, and/or a maximum distance between the orthogonal projection of the alignment mark region onto the first plane and a lower right rounded corner of the orthogonal projection of the active area boundary of the display panel onto the first plane may be smaller than the predetermined distance.

During the implementation, the predetermined distance may be set according to the practical need. For example, the predetermined distance may be, but not limited to, greater than or equal to 300 μm and smaller than or equal to 1100 μm.

In at least one embodiment of the present disclosure, when the circuit board is arranged at the lower side of the display panel, the alignment mark region may be arranged proximate to the lower left rounded corner of the active area boundary, and/or proximate to the lower right rounded corner of the active area boundary.

Figure 1D:
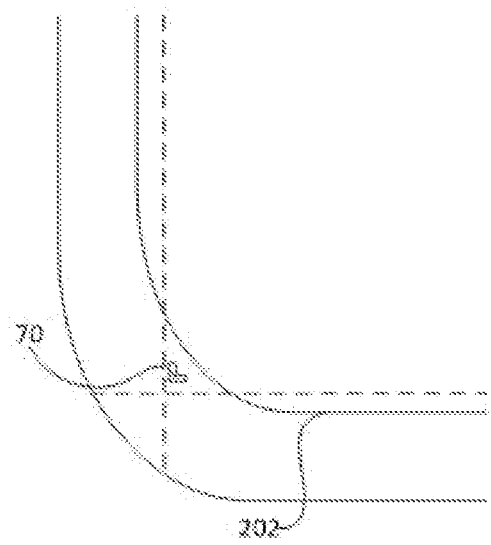
FIG. 1D is a schematic view showing that an alignment mark region 70 is arranged on the lower left portion of the four-surface-folding display panel.

As shown in FIG. 1D, when the alignment mark region 70 is arranged proximate to the lower left rounded corner of the active area boundary 202, the maximum distance between the orthogonal projection of the alignment mark region 70 onto the first plane and the lower left rounded corner of the active area boundary 202 may be a maximum distance between any point on a boundary of the orthogonal projection of the alignment mark region 70 onto the first plane and any point on the lower left rounded corner of the active area boundary 202. In FIG. 1D, the alignment mark region 70 may be of, but not limited to, an L-like shape.

In at least one embodiment of the present disclosure, when the alignment mark region is arranged proximate to the lower right rounded corner of the active area boundary, the maximum distance between the orthogonal projection of the alignment mark region onto the first plane and the lower right rounded corner of the orthogonal projection of the active area boundary of the display panel onto the first plane may refer to a maximum distance between any point on the boundary of the alignment mark region onto the first plane and any point on the lower right rounded corner of the active area boundary.

In another possible embodiment of the present disclosure, the first side surface may be the left side surface, the second side surface may be the lower side surface, the third side surface may be the upper side surface, and the fourth side surface may be the right side surface. The display panel may further include a circuit board arranged at the lower surface and at the upper side of the display panel. A maximum distance between an orthogonal projection of the alignment mark region onto the first plane and an upper left rounded corner of an orthogonal projection of an active area boundary of the display panel onto the first plane may be smaller than a predetermined distance, and/or a maximum distance between the orthogonal projection of the alignment mark region onto the first plane and an upper right rounded corner of the orthogonal projection of the active area boundary of the display panel onto the first plane may be smaller than the predetermined distance.

In at least one embodiment of the present disclosure, when the alignment mark region is arranged proximate to the upper left rounded corner of the active area boundary, the maximum distance between the orthogonal projection of the alignment mark region onto the first plane and the upper left rounded corner of the orthogonal projection of the active area boundary of the display panel onto the first plane may refer to a maximum distance between any point on a boundary of the orthogonal projection of the alignment mark region onto the first plane and any point on the upper left rounded corner of the active area boundary.

In at least one embodiment of the present disclosure, when the alignment mark region is arranged proximate to the upper right rounded corner of the active area boundary, the maximum distance between the orthogonal projection of the alignment mark region onto the first plane and the upper right rounded corner of the orthogonal projection of the active area boundary of the display panel onto the first plane may refer to a maximum distance between any point on the boundary of the orthogonal projection of the alignment mark region onto the first plane and any point on the upper right rounded corner of the active area boundary.

During the implementation, the predetermined distance may be set according to the practical need. For example, the predetermined distance may be, but not limited to, greater than or equal to 300 μm and smaller than or equal to 1100 μm.

In at least one embodiment of the present disclosure, when the circuit board is arranged at the upper side of the display panel, the alignment mark region may be arranged proximate to the upper left rounded corner of the active area boundary, and/or proximate to the upper right rounded corner of the active area boundary.

In at least one embodiment of the present disclosure, the first side surface may be the left side surface, the second side surface may be the lower side surface, the third side surface may be the upper side surface, and the fourth side surface may be the right side surface. The display panel may further include a circuit board arranged at the lower surface and at the lower side of the display panel. A maximum distance between an orthogonal projection of the alignment mark region onto the first plane and an upper left rounded corner of an orthogonal projection of an active area boundary of the display panel onto the first plane may be smaller than a predetermined distance, or a maximum distance between the orthogonal projection of the alignment mark region onto the first plane and an upper right rounded corner of the orthogonal projection of the active area boundary of the display panel onto the first plane may be smaller than the predetermined distance.

During the implementation, the predetermined distance may be set according to the practical need. For example, the predetermined distance may be, but not limited to, greater than or equal to 300 μm and smaller than or equal to 1100 μm.

In at least one embodiment of the present disclosure, when the circuit board is arranged at the lower side of the display panel, the alignment mark region may be arranged proximate to the upper left rounded corner of the active area boundary, and/or proximate to the upper right rounded corner of the active area boundary.

In at least one embodiment of the present disclosure, the first side surface may be the left side surface, the second side surface may be the lower side surface, the third side surface may be the upper side surface, and the fourth side surface may be the right side surface. The display panel may further include a circuit board arranged at the lower surface and at the upper side of the display panel. A maximum distance between an orthogonal projection of the alignment mark region onto the first plane and a lower left rounded corner of an orthogonal projection of an active area boundary of the display panel onto the first plane may be smaller than a predetermined distance, or a maximum distance between the orthogonal projection of the alignment mark region onto the first plane and a lower right rounded corner of the orthogonal projection of the active area boundary of the display panel onto the first plane may be smaller than the predetermined distance.

During the implementation, the predetermined distance may be set according to the practical need. For example, the predetermined distance may be, but not limited to, greater than or equal to 300 μm and smaller than or equal to 1100 μm.

In at least one embodiment of the present disclosure, when the circuit board is arranged at the upper side of the display panel, the alignment mark region may be arranged proximate to the lower left rounded corner of the active area boundary, and/or proximate to the lower right rounded corner of the active area boundary. In a possible embodiment of the present disclosure, the flat region may include a flat fan-out region, and the alignment mark region may be included in the flat fan-out region. The display panel may include a first metal layer on the base at the flat fan-out region, the first metal layer at the alignment mark region may be hollowed out, and the first metal layer may include a first metal pattern surrounding the alignment mark region at the flat fan-out region.

In at least one embodiment of the present disclosure, the first metal layer may include a plurality of metal connection lines arranged parallel to each other at the flat fan-out region. The metal connection line may be used for connecting the data line and the source driver, or connecting the gate line and the gate driver.

The first metal layer may also include a direct current voltage signal line having a certain width at the flat fan-out region, and the direct current voltage signal line may be a high voltage signal line or a low voltage signal line. When the direct current voltage signal line has a certain width, it is able to reduce a resistance of the direct current voltage signal line, thereby to reduce a voltage drop of a direct current voltage signal across the direct current voltage signal line.

In a possible embodiment of the present disclosure, the first metal layer may include, but not limited to, a gate metal layer and/or a source/drain metal layer, and the gate metal layer may include, but not limited to, a first gate metal layer and a second gate metal layer.

During the implementation, the alignment mark region may be included in the flat fan-out region. The first metal layer may be hollowed out at the alignment mark region, so as to form a fan-out opening. In addition, the first metal pattern in the first metal layer may surround the alignment mark region, so that light transmittance of the flat fan-out region other than the alignment mark region is relatively low and light transmittance of the alignment mark region is relatively high, thereby to form a contrast between bright field and a dark field and facilitate the identification of the alignment mark. In addition, it is unnecessary to provide the alignment mark in a separate space, so it is able to reduce a width of a bezel of the display panel and perform the alignment accurately.

In at least one embodiment of the present disclosure, the first metal pattern may include a connection line between the data line and the source driver, the first metal pattern may include a connection line between the gate line and the gate driver, and the first metal pattern may include a direct current voltage signal line, e.g., a high voltage signal line and/or a low voltage signal line.

During the implementation, the first metal layer may include a gate metal layer. The gate metal layer may include a first gate metal layer and a second gate metal layer that are arranged sequentially on the base and hollowed out at the alignment mark region. A first insulation layer may be arranged between the first gate metal layer and the second gate metal layer. The first insulation layer is transparent, so the first gate insulation layer may not be hollowed out at the alignment mark region.

Within an identification range of an alignment camera, due to dense lines at the fan-out region, when the alignment mark region is included in the flat fan-out region, the bright field and the dark field may be formed at the alignment mark region and the peripheral region respectively, resulting in an obvious contrast between the bright field and the dark field, so as to facilitate the identification.

In a possible embodiment of the present disclosure, the display panel may further include a semiconductor layer arranged between the base and the first metal layer at the flat fan-out region, the semiconductor layer may be hollowed out at a region of the flat fan-out region other than the alignment mark region, and the semiconductor layer may include an alignment mark pattern at the alignment mark region.

In the related art, no semiconductor layer may be arranged at the flat fan-out region. However, In at least one embodiment of the present disclosure, the semiconductor layer may be arranged between the base and the first metal layer at the flat fan-out region, and hollowed out at a region of the flat fan-out region other than the alignment mark region, i.e., not hollowed out at the alignment mark region, such that the semiconductor layer may include the alignment mark region. In this regard, it is able for the alignment camera to capture the alignment mark pattern in the semiconductor layer, thereby to perform the alignment accurately.

During the implementation, the display panel may further include an anode layer arranged at a surface of the first metal layer distal to the base at the alignment mark region, the anode layer may be not provided with any opening at the alignment mark region, and the anode layer may be provided with a plurality of openings arranged at intervals at a region other than the alignment mark region.

In at least one embodiment of the present disclosure, at the region of the display panel other than the alignment mark region, the anode layer may be provided with the plurality of openings (the adjacent openings may be spaced apart from each other at a certain distance) for the gas release of the organic film layer. When the anode layer is not provided with any opening at the alignment mark region, it is able for the alignment camera to conveniently identify the alignment mark region.

In a possible embodiment of the present disclosure, an edge of the orthogonal projection of the alignment mark region onto the base may be of, but not limited to, a polygonal, L-like or T-like shape.

FIGS. 4A, 4B, 4C and 4D are top views of the semiconductor layer, the first gate metal layer, the second gate metal layer and the anode layer sequentially arranged on the base at at least a part of the flat fan-out region. In FIGS. 4A, 4B, 4C and 4D, a hexagonal region 40 is the alignment mark region.

In the embodiments corresponding to FIGS. 4A, 4B, 4C and 4D, the first metal layer may include a gate metal layer, and the gate metal layer may include a first gate metal layer and a second gate metal layer.

Figure 4A:
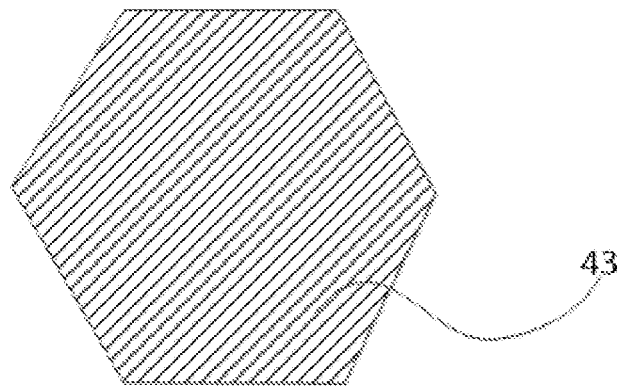
FIGS. 4A, 4B, 4C and 4D are top views of a semiconductor layer, a first gate metal layer, a second gate metal layer and an anode layer sequentially arranged on a base within at least a part of a flat fan-out region.

As shown in FIG. 4A, the semiconductor layer may be hollowed out at a region of the flat fan-out region other than the alignment mark region 40, so that the semiconductor layer includes the alignment mark pattern 43 at the alignment mark region.

Figure 4B:
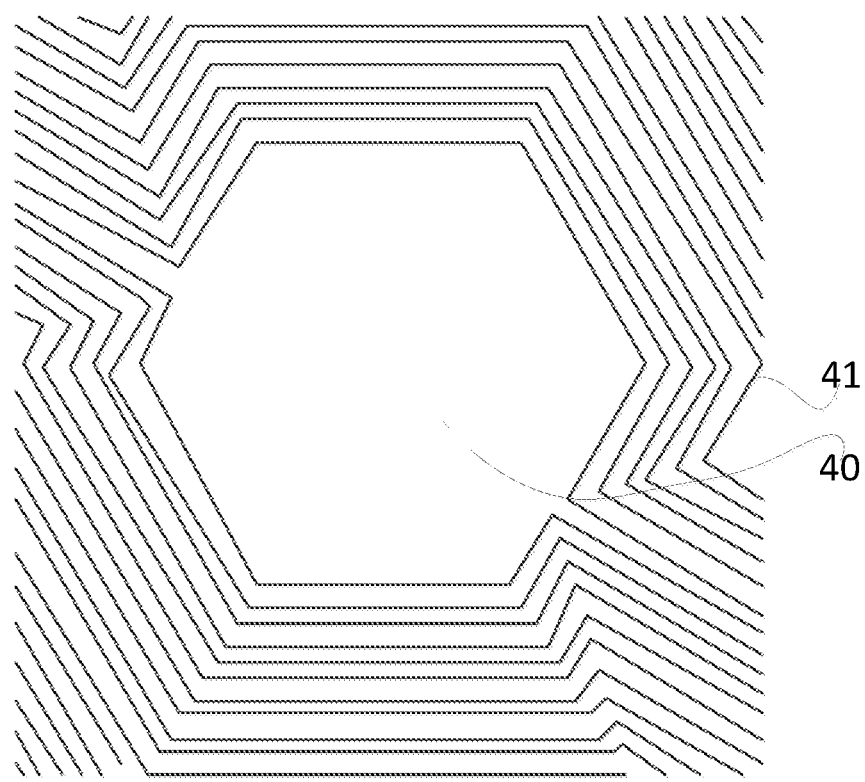

As shown in FIG. 4B, a first gate metal pattern 41 of the first gate metal layer may surround the alignment mark region 40, and the first gate metal layer may be hollowed out at the alignment mark region 40.

Figure 4C:
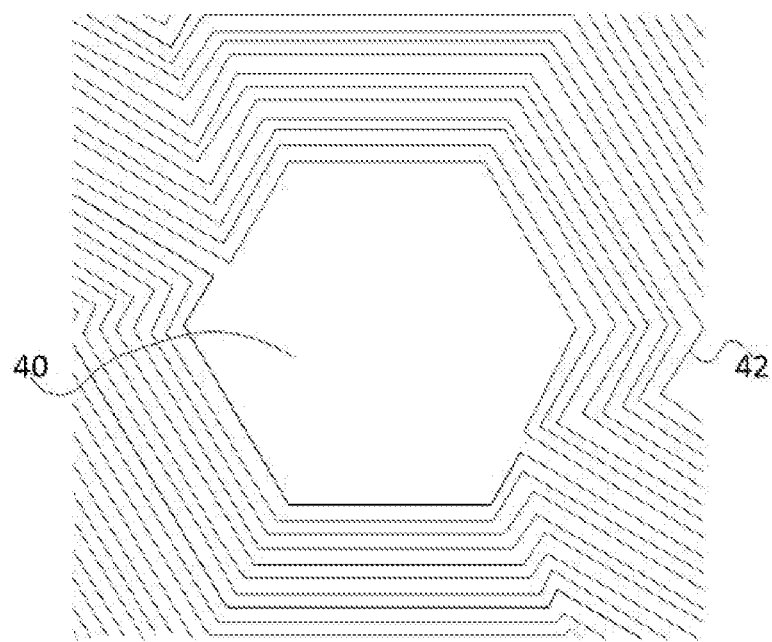

As shown in FIG. 4C, a second gate metal pattern 42 of the second gate metal layer may surround the alignment mark region 40, and the second gate metal layer may be hollowed out at the alignment mark region 40.

Figure 4D:
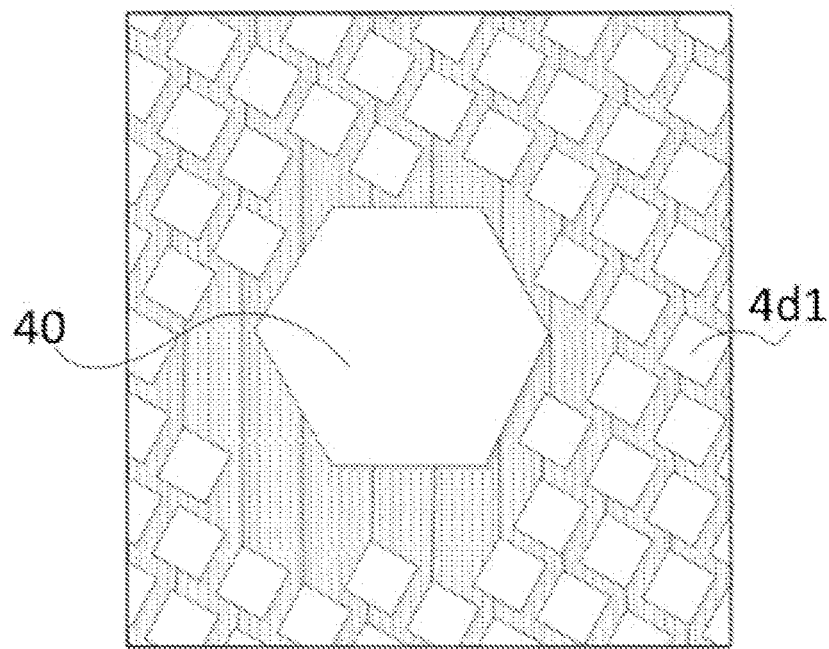

As shown in FIG. 4D, the anode layer may not be provided with any opening at the alignment mark region 40, so that the alignment camera may identify the alignment mark region 40. The anode layer may be provided with a plurality of openings 4d1 at a region of the flat fan-out region other than the alignment mark region 40 (the adjacent openings 4d1 may be spaced apart from each other at a certain distance). The anode layer may be hollowed out to form the opening 4d1 for the gas release of the organic film layer.

In at least one embodiment of the present disclosure, a shape of the edge of the orthogonal projection of the alignment mark region 40 onto the base may be set according to the practical need. For example, the edge may be of a polygonal, L-like or T-like shape.

During the implementation, at the flat fan-out region, a second insulation layer may be arranged between the semiconductor layer and the first gate metal layer, a first insulation layer may be arranged between the first gate metal layer and the second gate metal layer, and a third insulation layer may be arranged between the second gate metal layer and the anode layer. The first insulation layer, the second insulation layer and the third insulation layer each has relatively high light transmittance, so they are not necessarily hollowed out at the alignment mark region.

During the implementation, the first insulation layer, the second insulation layer and the third insulation layer may be made of, but not limited to, silicon oxide or silicon nitride.

In another possible embodiment of the present disclosure, the flat region may include a flat signal line region, the alignment mark region may be included in the flat signal line region, the display panel may include a semiconductor layer arranged on the base at the alignment mark region, and the semiconductor layer may include an alignment mark pattern.

In at least one embodiment of the present disclosure, the flat region may include the flat signal line region, and the alignment mark pattern may be arranged at the alignment mark region included in the flat signal line region. The display panel may include the semiconductor layer arranged on the base at the alignment mark region included in the flat signal line region, and the semiconductor layer may include the alignment mark pattern.

In a possible embodiment of the present disclosure, an orthogonal projection of the alignment mark pattern onto the base may be of an L-like, T-like or polygonal shape.

During the implementation, when the alignment mark region is included in the flat signal line region, the display panel includes the semiconductor layer on the base at the alignment mark region and the semiconductor layer includes the alignment mark pattern, the display panel may further include a source/drain metal layer arranged at a surface of the semiconductor layer distal to the base, and the source/drain metal layer may include a low voltage signal line.

In addition, at the flat signal line region, the display panel may further include an anode layer arranged at a surface of the source/drain metal layer distal to the semiconductor layer. When the anode layer is arranged on the source/drain metal layer, it is able for a cathode of a light-emitting element at the active area to be lapped onto the low voltage signal line (an area of the anode layer covering the source/drain metal layer is determined by a lapping condition of the low voltage signal line and the cathode). The semiconductor layer under the source/drain metal layer may be provided with the alignment mark pattern, so as to enable the alignment camera to accurately acquire the alignment mark pattern from the back surface of the display panel. Through this scheme, it is able to prevent the layout of the other circuitries for the back plate from being adversely affected without increasing a width of a bezel, and enable the alignment camera to accurately acquire the alignment mark pattern for the alignment.

Figure 5A:
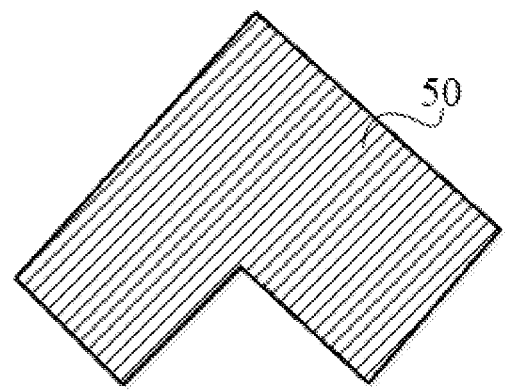
FIGS. 5A, 5B and 5C are top views of the semiconductor layer, a source/drain metal layer and the anode layer sequentially arranged on the base within at least a part of the flat signal line region.
Figure 5B:
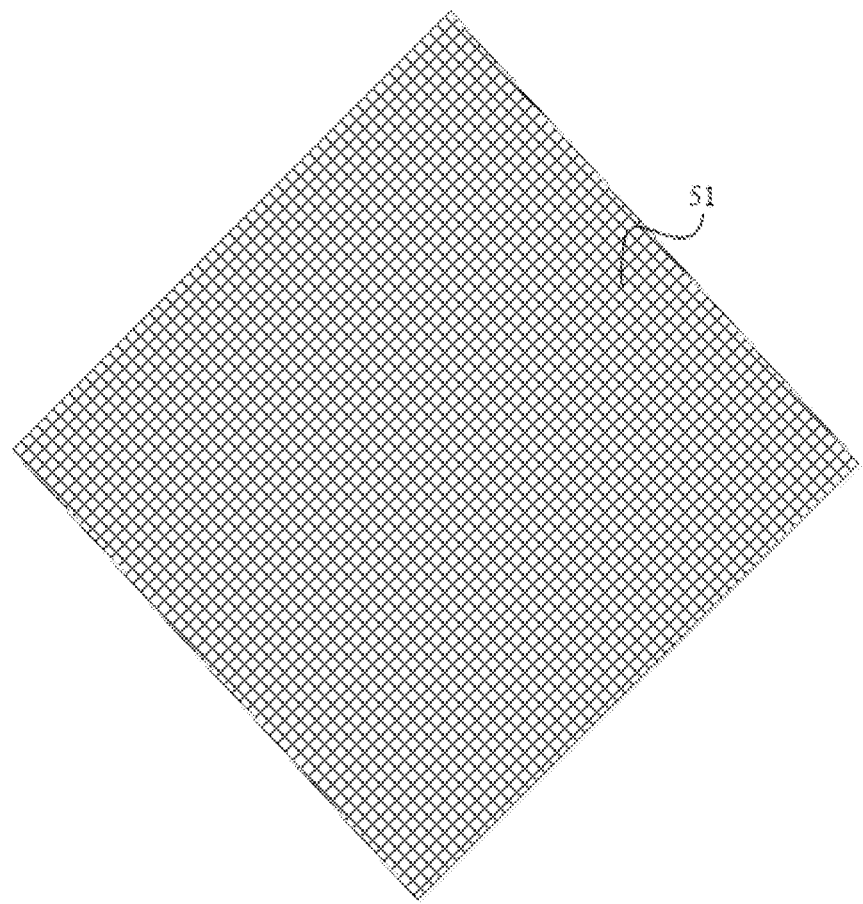
Figure 5C:
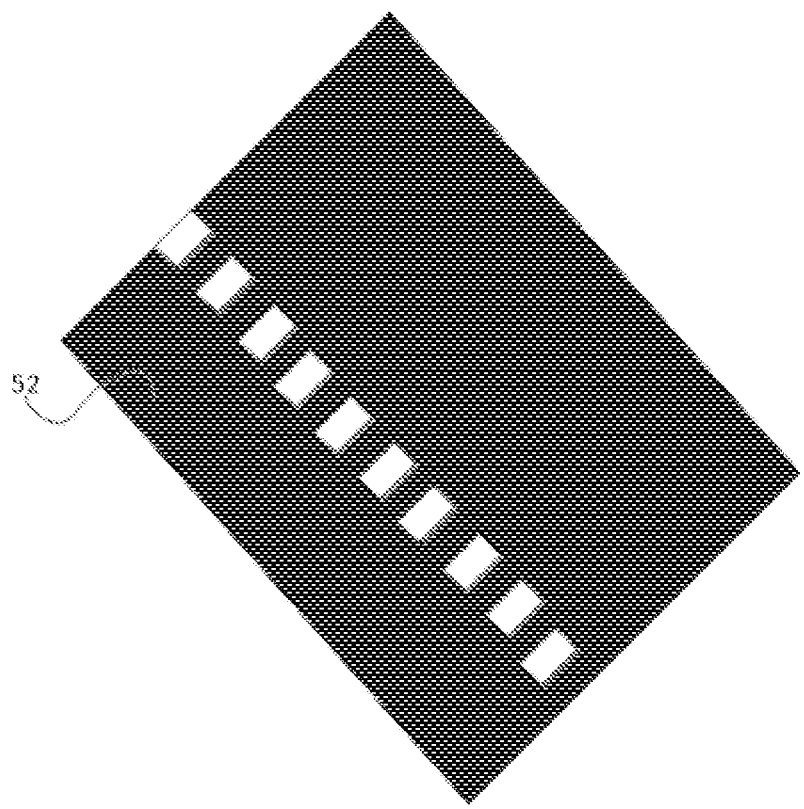

FIGS. 5A, 5B and 5C are top views of the semiconductor layer, the source/drain metal layer and the anode layer sequentially arranged on the base at at least a part of the flat signal line region.

As shown in FIG. 5A, the semiconductor layer includes the alignment mark pattern 50 at the alignment mark region included in the flat signal line region.

As shown in FIG. 5B, the sign 51 represents a low voltage signal line in the source/drain metal layer at at least a part of the flat signal line region.

As shown in FIG. 5C, the sign 52 represents the anode layer arranged on the source/drain metal layer at at least a part of the flat signal line region.

Figure 6A:
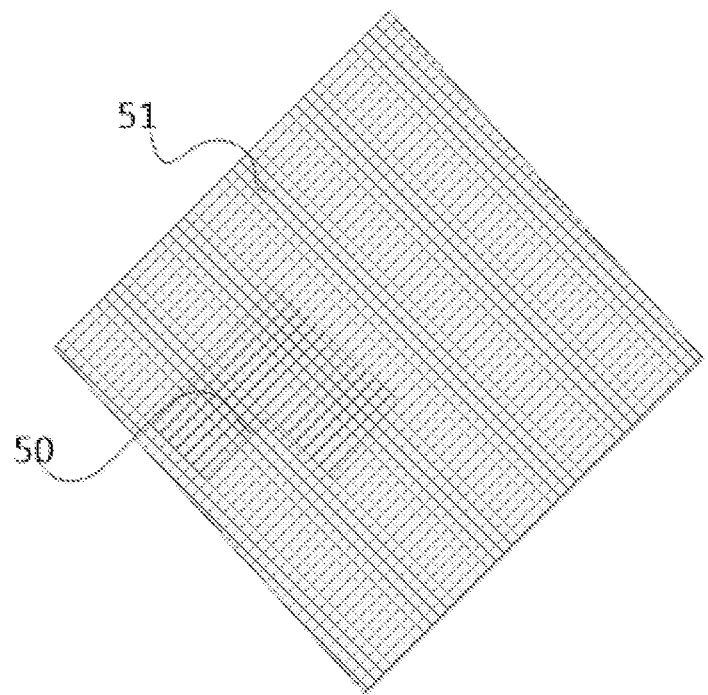
FIG. 6A is a schematic view showing layers acquired after the layers in FIGS. 5A and 5B are superimposed one on another.
Figure 6B:
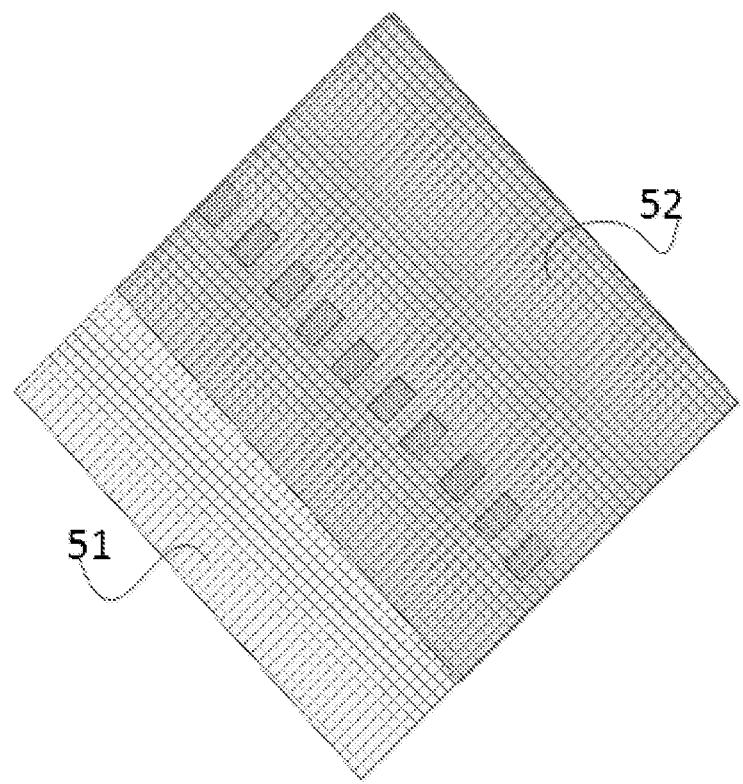
FIG. 6B is a schematic view showing layers after the layers in FIGS. 5B and 5C are superimposed one on another.

FIG. 6A is a schematic view showing layers acquired after the layers in FIGS. 5A and 5B are superimposed one on another, and FIG. 6B is a schematic view showing layers after the layers in FIGS. 5B and 5C are superimposed one on another.

During the implementation, the flat region may include a flat signal line region, and the alignment mark region may be included in the flat signal line region. The display panel may include a second metal layer arranged on the base at the flat signal line region, and the second metal layer may be hollowed out at the alignment mark region.

In at least one embodiment of the present disclosure, the alignment mark region may be included in the flat signal line region, and the display panel may include the second metal layer at the flat signal line region. The second metal layer may be hollowed out at the alignment mark region, so as to form a light-transmissible alignment mark. Light transmittance of the alignment mark region is greater than that of the peripheral region, so as to perform the alignment accurately.

In a possible embodiment of the present disclosure, the second gate metal layer may include, but not limited to, a source/drain metal layer and/or a gate metal layer.

During the implementation, the second gate metal layer may include a signal line, and the signal line may include a direct current voltage signal line. When the signal line includes the direct current voltage signal line, the signal line may include, but not limited to, a low voltage signal line and/or a high voltage signal line.

In at least one embodiment of the present disclosure, when the second metal layer includes the source/drain metal layer and the source/drain metal layer includes the low voltage signal line, the display panel may further include an anode layer arranged at a surface of the source/drain metal layer distal to the base at the flat signal line region. When the anode layer covers the source/drain metal layer, it is able for a cathode of a light-emitting element at the active area to be lapped onto the low voltage signal line (an area of the anode layer covering the source/drain metal layer is determined by a lapping condition of the low voltage signal line and the cathode).

In a possible embodiment of the present disclosure, an edge of an orthogonal projection of the alignment mark region onto the base may be of an L-like, T-like or polygonal shape.

Figure 6C:
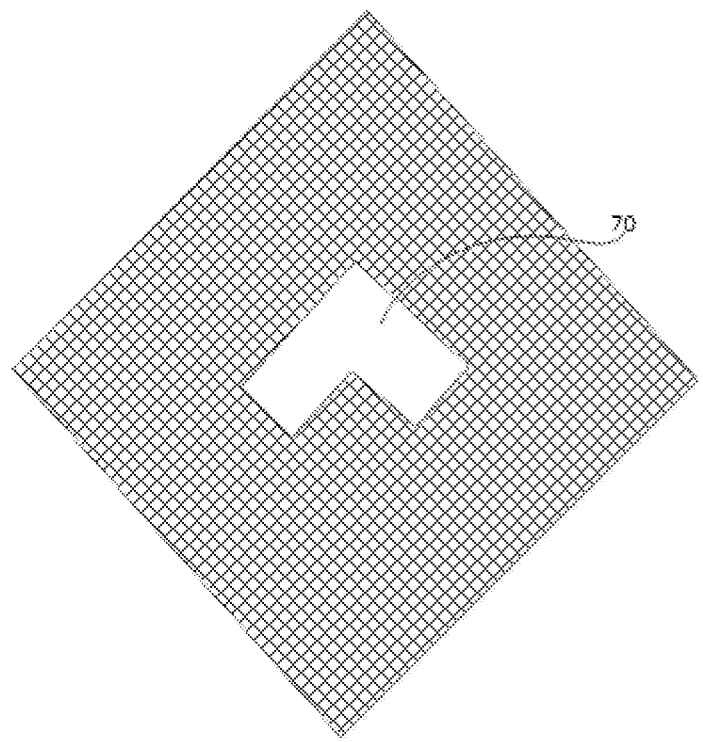
FIG. 6C is a schematic view showing at least a part of source/drain metal pattern of a source/drain metal layer at the flat signal line region.

FIG. 6C shows at least a part of a source/drain metal pattern of the source/drain metal layer at the flat signal line region. As shown in FIG. 6C, the flat signal line region includes the alignment mark region 70, and the source/drain metal layer is hollowed out at the alignment mark region 70, so as to form a light-transmissible alignment mark. Light transmittance of the alignment mark region 70 may be greater than that of the peripheral region, so as to perform the alignment accurately.

In the embodiment of FIG. 6C, an edge of the orthogonal projection of the alignment mark region 70 onto the base may be, but not limited to, an L-like shape.

In another possible embodiment of the present disclosure, the flat region may include a flat dummy driving circuitry region, and the alignment mark region may be included in the flat dummy driving circuitry region. The display panel may include a semiconductor layer, a third metal layer and a fourth metal layer arranged sequentially on the base at the alignment mark region. The third metal layer and the fourth metal layer may be hollowed out at the alignment mark region. Preferably, the semiconductor layer may also be hollowed out at the alignment mark region.

In a possible embodiment of the present disclosure, the third metal layer may include, but not limited to, a gate metal layer, and the fourth metal layer may include, but not limited to, a source/drain metal layer.

During the implementation, the alignment mark region may be included in the flat dummy driving circuitry region. Except the alignment mark region, dense lines are provided at the peripheral region adjacent to the alignment mark region, and these lines are nontransparent to visible light. In a certain backlight source condition, these lines may be black in a field of view of the alignment camera. However, no line is arranged at the alignment mark region, and almost all the backlight light may pass through the alignment mark region and enter the alignment camera, i.e., there is a sharp contrast between the alignment mark region and the peripheral region. In this regard, it is able for the alignment camera to identify the alignment mark region.

During the implementation, the display panel may further include an anode layer arranged at a surface of the fourth metal layer distal to the second metal layer at the alignment mark region. The anode layer may not be provided with any opening at the alignment mark region, so as to enable the alignment camera to identify the alignment mark region. The anode layer may be provided with a plurality of openings at intervals at a region other than the alignment mark region.

In a possible embodiment of the present disclosure, an edge of an orthogonal projection of the alignment mark region onto the base may be of a polygonal, L-like or T-like shape.

In at least one embodiment of the present disclosure, the third metal layer may include a gate metal layer, and the gate metal layer may include a first gate metal layer and a second gate metal layer sequentially arranged on a surface of the semiconductor layer distal to the base.

Figure 7:
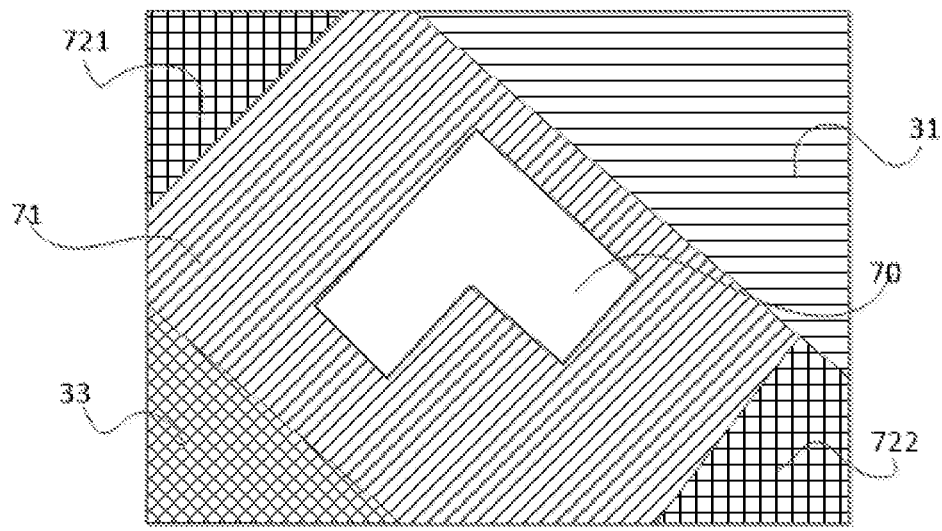
FIG. 7 is a schematic view showing a part of a driving circuitry region and a part of a fan-out region 30.

FIG. 7 shows a part of the driving circuitry region, a part of the fan-out region 31 and a part of the signal line region 33.

As shown in FIG. 7, the flat region may include a flat dummy driving circuitry region 71, the alignment mark region 70 may be included in the flat dummy driving circuitry region 71, and the flat dummy driving circuitry region 71 may be included in the driving circuitry region. Apart from the flat dummy driving circuitry region 71, the driving circuitry region may further include a first driving circuitry region 721 and a second driving circuitry region 722, and the flat dummy driving circuitry region 71 may include the alignment mark region 70.

At the alignment mark region 70, the display panel may include a semiconductor layer, a first gate metal layer, a second gate metal layer, a source/drain metal layer and an anode layer arranged sequentially on the base.

At least one level of dummy shift register unit may be arranged at a region of the flat dummy driving circuitry region 71 other than the alignment mark region 70, and a driving circuitry including a plurality of levels of shift register units may be arranged at the first driving circuitry region 721 and the second driving circuitry region 722.

At the alignment mark region 70, the semiconductor layer, the gate metal layer and the source/drain metal layer may be hollowed out, so that light transmittance of the alignment mark region 70 is far greater than light transmittance of a region of the driving circuitry region adjacent to the alignment mark region 70, so as to enable the alignment camera to accurately identify the alignment mark region. In addition, it is unnecessary to provide the alignment mark in a separate space, so it is able to reduce a width of a bezel of the display panel and perform the alignment accurately.

At the alignment mark region 70, the anode layer may not be provided with any opening, so as to enable the alignment camera to identify the alignment mark region 70.

At the driving circuitry region other than the alignment mark region 70, the anode layer may be provided with a plurality of openings for the gas release of the organic film layer.

In the embodiments as shown in FIGS. 7, and 8A-8G, the third gate metal layer may include a gate metal layer, the gate metal layer may include a first gate metal layer and a second gate metal layer, and the fourth metal layer may include a source/drain metal layer.

As shown in FIG. 7, the edge of the orthogonal projection of the alignment mark region 70 onto the base may be of, but not limited to, an L-like shape. During the implementation, the edge of the orthogonal projection of the alignment mark region 70 onto the base may also be of any other shape.

Figure 8A:
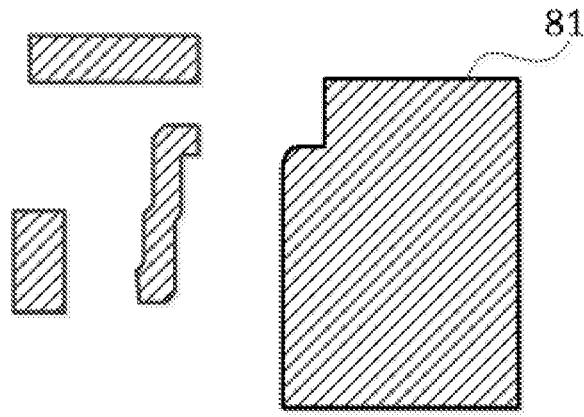
FIG. 8A is a top view of an active pattern 81 of the semiconductor layer on the base at a flat dummy driving circuitry region according to an embodiment.
Figure 8B:
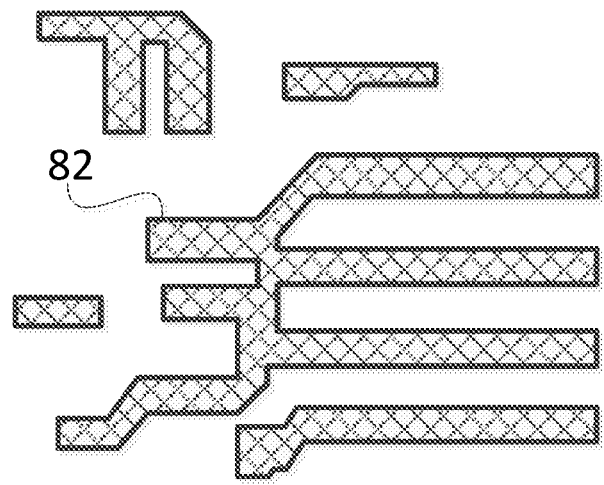
FIG. 8B is a top view of a first gate metal pattern 82 of the first gate metal layer arranged above the semiconductor layer at the flat dummy driving circuitry region according to an embodiment.
Figure 8C:
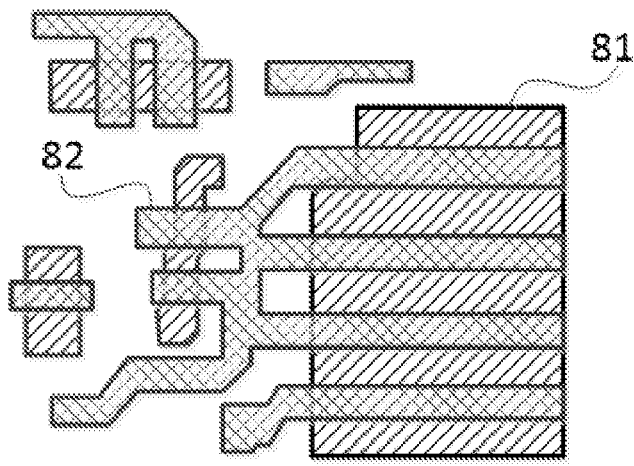
FIG. 8C is a schematic view showing a pattern acquired after the patterns in FIGS. 8A and 8B are superimposed one on another at the flat dummy driving circuitry region.
Figure 8D:
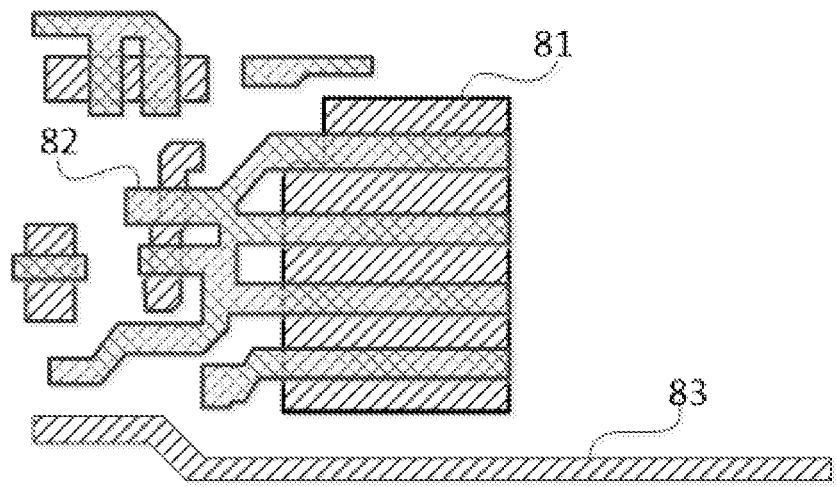
FIG. 8D is a schematic view showing a pattern acquired after a second gate metal pattern 83 of the second gate metal layer is added at the flat dummy driving circuitry region on the basis of FIG. 8C.
Figure 8E:
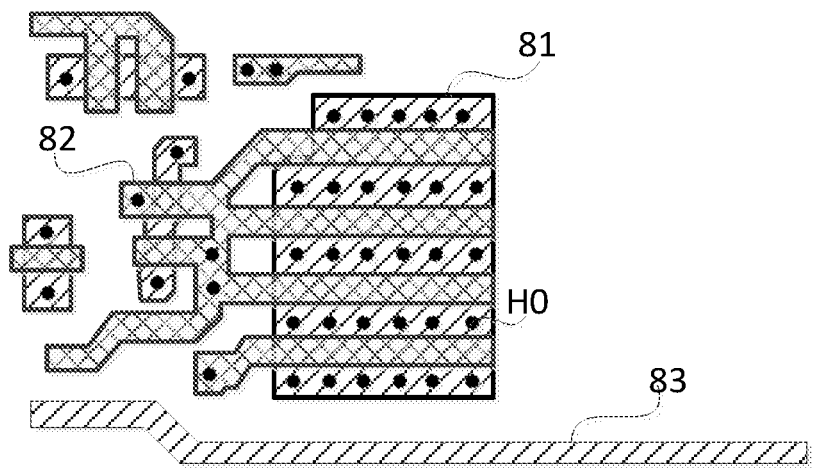
FIG. 8E is a schematic view showing a plurality of via-holes H0 after the formation of the semiconductor layer, the first gate metal layer and the second gate metal layer at the flat dummy driving circuitry region.
Figure 8F:
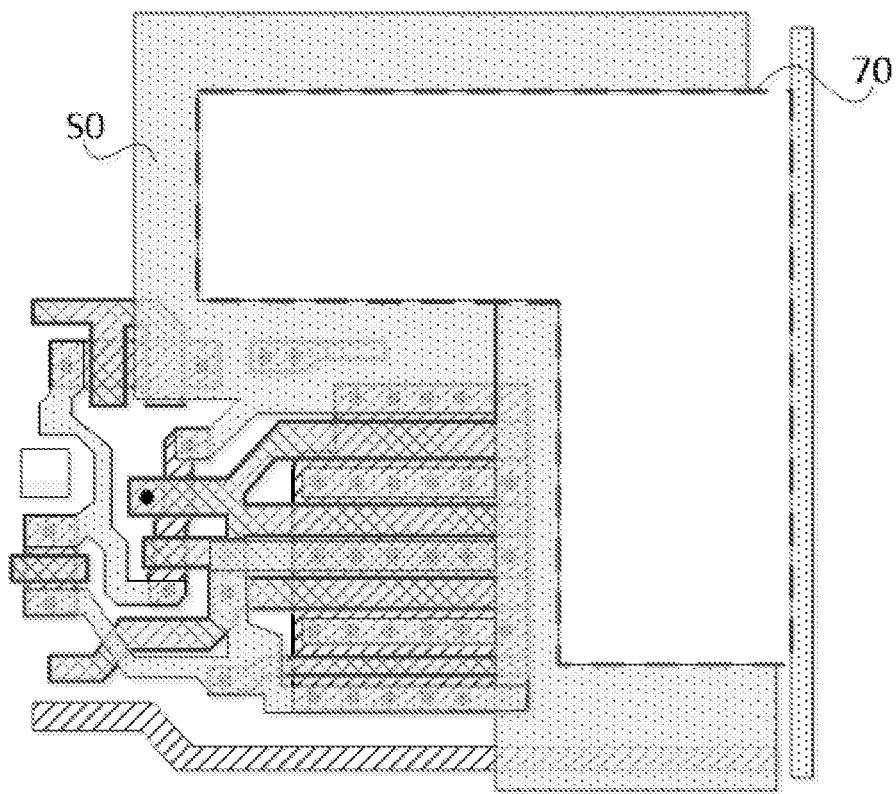
FIG. 8F is a schematic view showing the source/drain metal layer S0 at the flat dummy driving circuitry region after the formation of the plurality of via-holes H0.
Figure 8G:
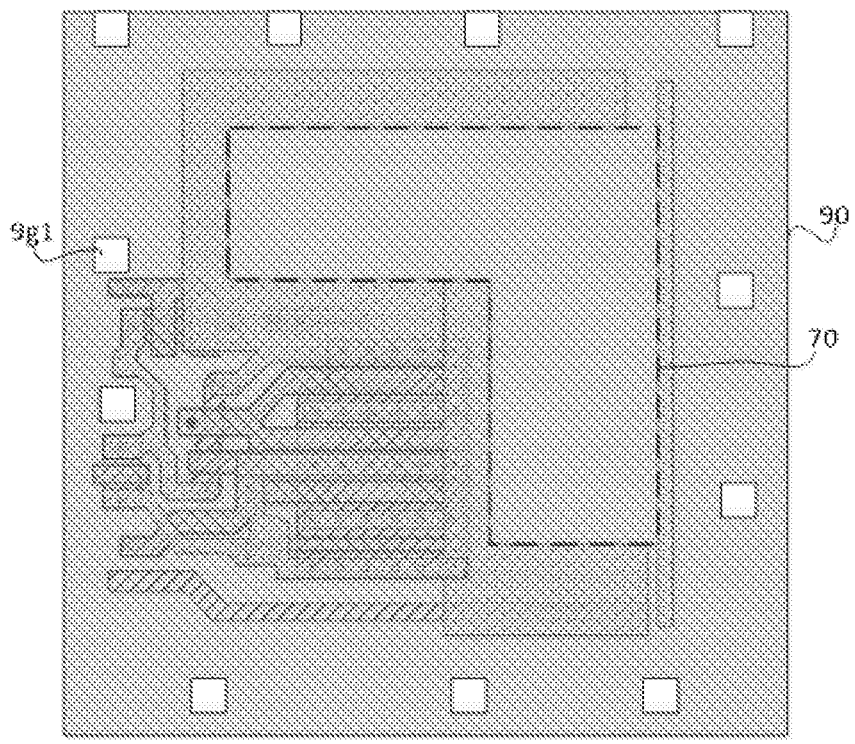
FIG. 8G is a schematic view showing the anode layer 90 on the source/drain metal layer at the flat dummy driving circuitry region.

FIG. 8A is a top view of an active pattern 81 of the semiconductor layer arranged on the base at the flat dummy driving circuitry region according to an embodiment, FIG. 8B is a top view of a first gate metal pattern 82 of the first gate metal layer arranged above the semiconductor layer at the flat dummy driving circuitry region according to an embodiment, FIG. 8C is a schematic view showing a pattern acquired after the patterns in FIGS. 8A and 8B are superimposed one on another at the flat dummy driving circuitry region, FIG. 8D is a schematic view showing a pattern acquired after a second gate metal pattern 83 of the second gate metal layer is added at the flat dummy driving circuitry region on the basis of FIG. 8C, FIG. 8E is a schematic view showing a plurality of via-holes H0 after the formation of the semiconductor layer, the first gate metal layer and the second gate metal layer sequentially at the flat dummy driving circuitry region, and FIG. 8F is a schematic view showing the source/drain metal layer S0 at the flat dummy driving circuitry region after the formation of the plurality of via-holes H0. As shown in FIG. 8F, at the alignment mark region 70, the first gate metal layer, the second gate metal layer, the semiconductor layer and the source/drain metal layer may be hollowed out. FIG. 8G is a schematic view showing an anode layer 90 on the source/drain metal layer at the flat dummy driving circuitry region. The anode layer 90 may not be provided with any opening at the alignment mark region 70, so as to enable the alignment camera to identify the alignment mark region 70. The anode layer 90 may be provided with a plurality of openings 9g1 at a region other than the alignment mark region 70.

In FIGS. 8F and 8G, a region surrounded by a dashed line represents the alignment mark region 70. The edge of the orthogonal projection of the alignment mark region 70 onto the base may be of, but not limited to, an L-like shape.

During the implementation, at the flat dummy driving circuitry region, a second insulation layer may be arranged between the semiconductor layer and the first gate metal layer, a first insulation layer may be arranged between the first gate metal layer and the second gate metal layer, a fourth insulation layer may be arranged between the second gate metal layer and the source/drain metal layer, and a fifth insulation layer may be arranged between the source/drain metal layer and the anode layer. Because light transmittance of the first insulation layer, light transmittance of the second insulation layer, light transmittance of the fourth insulation layer and light transmittance of the fifth insulation layer are relatively high, the first insulation layer, the second insulation layer, the fourth insulation layer and the fifth insulation layer may not be hollowed out at the alignment mark region.

In at least one embodiment of the present disclosure, the first insulation layer, the second insulation layer, the fourth insulation layer and the fifth insulation layer may each be made of, but not limited to, silicon oxide or silicon nitride.

The present disclosure further provides in some embodiments a method for manufacturing a display panel, which includes providing an alignment mark region within a flat region of a peripheral region of the display panel. An alignment mark pattern may be arranged at the alignment mark region, and/or at least one film layer within the alignment mark region may be hollowed out. The peripheral region may be a region of the display panel other than an active area.

According to the method in at least one embodiment of the present disclosure, the alignment mark region may be formed at the flat region of the peripheral region of the display panel. The alignment mark pattern may be arranged at the alignment mark region, or at least one film layer within the alignment mark region may be hollowed out. Because at least one film layer within the alignment mark region is hollowed out, light transmittance of the alignment mark region may be greater than that of the peripheral region. As a result, it is able to perform the alignment accurately.

In at least one embodiment of the present disclosure, the peripheral region may be a region adjacent to the alignment mark region.

In a possible embodiment of the present disclosure, the film layer may include a metal layer, i.e., at least one metal layer may be hollowed out at the alignment mark region.

During the implementation, the display panel may be provided with a flat surface at the flat region.

In a possible embodiment of the present disclosure, the display panel may include an upper surface, a lower surface, a first side surface, a second side surface, a third side surface and a fourth side surface. The first side surface, the second side surface, the third side surface and the fourth side surface may be curved side surfaces, an orthogonal projection of the first side surface onto a first plane may not overlap an orthogonal projection of the flat region onto the first plane, an orthogonal projection of the second side surface onto the first plane may not overlap the orthogonal projection of the flat region onto the first plane, an orthogonal projection of the third side surface onto the first plane may not overlap the orthogonal projection of the flat region onto the first plane, an orthogonal projection of the fourth side surface onto the first plane may not overlap the orthogonal projection of the flat region onto the first plane, and the first plane may be parallel to the lower surface.

In a possible embodiment of the present disclosure, the first side surface may be the left side surface, the second side surface may be the lower side surface, the third side surface may be the upper side surface, and the fourth side surface may be the right side surface. The display panel may further include a circuit board arranged at the lower surface and at the lower side of the display panel. A maximum distance between an orthogonal projection of the alignment mark region onto the first plane and a lower left rounded corner of an orthogonal projection of an active area boundary of the display panel onto the first plane may be smaller than a predetermined distance, a maximum distance between the orthogonal projection of the alignment mark region onto the first plane and a lower right rounded corner of the orthogonal projection of the active area boundary of the display panel onto the first plane may be smaller than the predetermined distance.

During the implementation, the predetermined distance may be set according to the practical need. For example, the predetermined distance may be, but not limited to, greater than or equal to 300 µm and smaller than or equal to 1100 µm.

In at least one embodiment of the present disclosure, when the circuit board is arranged at the lower side of the display panel, the alignment mark region may be arranged proximate to the lower left rounded corner of the active area boundary, and/or proximate to the lower right rounded corner of the active area boundary.

In at least one embodiment of the present disclosure, the first side surface may be the left side surface, the second side surface may be the lower side surface, the third side surface may be the upper side surface, and the fourth side surface may be the right side surface. The display panel may further include a circuit board arranged at the lower surface and at the upper side of the display panel. A maximum distance between an orthogonal projection of the alignment mark region onto the first plane and an upper left rounded corner of an orthogonal projection of an active area boundary of the display panel onto the first plane may be smaller than a predetermined distance, a maximum distance between the orthogonal projection of the alignment mark region onto the first plane and an upper right rounded corner of the orthogonal projection of the active area boundary of the display panel onto the first plane may be smaller than the predetermined distance.

During the implementation, the predetermined distance may be set according to the practical need. For example, the predetermined distance may be, but not limited to, greater than or equal to 300 µm and smaller than or equal to 1100 µm.

In at least one embodiment of the present disclosure, when the circuit board is arranged at the upper side of the display panel, the alignment mark region may be arranged proximate to the upper left rounded corner of the active area boundary, and/or proximate to the upper right rounded corner of the active area boundary.

In at least one embodiment of the present disclosure, the first side surface may be the left side surface, the second side surface may be the lower side surface, the third side surface may be the upper side surface, and the fourth side surface may be the right side surface. The display panel may further include a circuit board arranged at the lower surface and at the lower side of the display panel. A maximum distance between an orthogonal projection of the alignment mark region onto the first plane and an upper left rounded corner of an orthogonal projection of an active area boundary of the display panel onto the first plane may be smaller than a predetermined distance, and/or a maximum distance between the orthogonal projection of the alignment mark region onto the first plane and an upper right rounded corner of the orthogonal projection of the active area boundary of the display panel onto the first plane may be smaller than the predetermined distance.

During the implementation, the predetermined distance may be set according to the practical need. For example, the predetermined distance may be, but not limited to, greater than or equal to 300 µm and smaller than or equal to 1100 µm.

In at least one embodiment of the present disclosure, when the circuit board is arranged at the lower side of the display panel, the alignment mark region may be arranged adjacent to the upper left rounded corner of the active area boundary, and/or adjacent to the upper right rounded corner of the active area boundary.

In at least one embodiment of the present disclosure, the first side surface may be the left side surface, the second side surface may be the lower side surface, the third side surface may be the upper side surface, and the fourth side surface may be the right side surface. The display panel may further include a circuit board arranged at the lower surface and at the upper side of the display panel. A maximum distance between an orthogonal projection of the alignment mark region onto the first plane and a lower left rounded corner of an orthogonal projection of an active area boundary of the display panel onto the first plane may be smaller than a predetermined distance, and/or a maximum distance between the orthogonal projection of the alignment mark region onto the first plane and a lower right rounded corner of the orthogonal projection of the active area boundary of the display panel onto the first plane may be smaller than the predetermined distance.

During the implementation, the predetermined distance may be set according to the practical need. For example, the predetermined distance may be, but not limited to, greater than or equal to 300 µm and smaller than or equal to 1100 µm.

In at least one embodiment of the present disclosure, when the circuit board is arranged at the upper side of the display panel, the alignment mark region may be arranged adjacent to the lower left rounded corner of the active area boundary, and/or adjacent to the lower right rounded corner of the active area boundary.

In a possible embodiment of the present disclosure, the flat region may include a flat fan-out region, and the alignment mark region may be included in the flat fan-out region. The providing the alignment mark region within the flat region of the peripheral region of the display panel may include forming a first metal layer on a surface of a base at the flat fan-out region, patterning the first metal layer to form a first metal pattern, and enabling the first metal layer at the alignment mark region to be hollowed out. The first metal pattern may surround the alignment mark region.

During the implementation, the alignment mark region may be included in the flat fan-out region. The first metal layer may be hollowed out at the alignment mark region to form a fan-out opening, so that light transmittance of the flat fan-out region other than the alignment mark region is relatively low and light transmittance of the alignment mark region is relatively high, thereby to form a contrast between a bright field and a dark field and facilitate the identification of the alignment mark. In addition, it is unnecessary to provide the alignment mark in a separate space, so it is able to reduce a width of a bezel of the display panel and perform the alignment accurately.

In a possible embodiment of the present disclosure, the first metal layer may include, but not limited to, a gate metal layer and/or a source/drain metal layer, and the gate metal layer may include, but not limited, a first gate metal layer and a second gate metal layer.

In another possible embodiment of the present disclosure, the flat region may include a flat fan-out region, and the alignment mark region may be included in the flat fan-out region. The providing the alignment mark region within the flat region of the peripheral region of the display panel may include: within the flat fan-out region, forming a semiconductor layer on a base, and patterning the semiconductor layer to enable the semiconductor layer to be hollowed out at a region of the flat fan-out region other than the alignment mark region; and forming a first metal layer at a surface of the semiconductor layer distal to the base, and patterning the first metal layer to form a first metal pattern and enable the first metal layer at the alignment mark region to be hollowed out. The first metal pattern may surround the alignment mark region.

In the related art, no semiconductor layer may be arranged at the flat fan-out region. In contrast, in at least one embodiment of the present disclosure, the semiconductor layer may be arranged between the base and the first metal layer at the flat fan-out region, and hollowed out at a region of the flat fan-out region other than the alignment mark region, i.e., not hollowed out at the alignment mark region, such that the semiconductor layer may include the alignment mark pattern. In this regard, it is able for the alignment camera to capture the alignment mark pattern in the semiconductor layer, thereby to perform the alignment accurately.

In yet another possible embodiment of the present disclosure, the flat region may include a flat signal line region, and the alignment mark region may be included in the flat signal line region. The providing the alignment mark region within the flat region of the peripheral region of the display panel may include: within the flat signal line region, forming a semiconductor layer arranged on the base, and patterning the semiconductor layer to form an alignment mark pattern arranged at the alignment mark region.

In at least one embodiment of the present disclosure, the flat region may include the flat signal line region, and the alignment mark pattern may be arranged at the alignment mark region included in the flat signal line region. At the alignment mark region included in the flat signal line region, the display panel may include the semiconductor layer arranged on the base, and the semiconductor layer may include the alignment mark pattern.

In still yet another possible embodiment of the present disclosure, the flat region may include a flat signal line region, and the alignment mark region may be included in the flat signal line region. The providing the alignment mark region within the flat region of the peripheral region of the display panel may include forming a second metal layer on a surface of the base at the flat signal line region, and enabling the second metal layer to be hollowed out at the alignment mark region.

In at least one embodiment of the present disclosure, the flat region may include the flat signal line region, and the alignment mark region may be included in the flat signal line region. At the alignment mark region, the second metal layer may be hollowed out to form a light-transmissible alignment mark. Light transmittance of the alignment mark region may be greater than that of the peripheral region, so it is able to perform the alignment accurately.

In a possible embodiment of the present disclosure, the second metal layer may include, but not limited to, a source/drain metal layer and/or a gate metal layer.

During the implementation, in at least one embodiment of the present disclosure, the method may further include patterning the second metal layer to form a signal line.

In a possible embodiment of the present disclosure, the signal line may include a direct current voltage signal line. When the signal line includes the direct current voltage signal line, the signal line may include a low voltage signal line and/or a high voltage signal line.

In still yet another possible embodiment of the present disclosure, the flat region may include a flat dummy driving circuitry region, and the alignment mark region may be included in the flat dummy driving circuitry region. The providing the alignment mark region within the flat region of the peripheral region of the display panel may include: forming a semiconductor layer on the base at the flat dummy driving circuitry region, and patterning the semiconductor layer to form an active pattern; forming a third metal layer at a surface of the semiconductor layer distal to the base, patterning the third metal layer to form a third metal pattern, and enabling the third metal layer to be hollowed out at the alignment mark region; and forming a fourth metal layer at a surface of the third metal layer distal to the semiconductor layer, patterning the fourth metal layer to form a fourth metal pattern, and enabling the fourth metal layer to be hollowed out at the alignment mark region.

In a possible embodiment of the present disclosure, the third metal layer may include, but not limited to, a gate metal layer, and the fourth metal layer may include, but not limited to, a source/drain metal layer.

In still yet another possible embodiment of the present disclosure, the flat region may include a flat dummy driving circuitry region, and the alignment mark region may be included in the flat dummy driving circuitry region. The providing the alignment mark region within the flat region of the peripheral region of the display panel may include: forming a semiconductor layer on the base at the flat dummy driving circuitry region, patterning the semiconductor layer to form an active pattern, and enabling the semiconductor layer to be hollowed out at the alignment mark region; forming a third metal layer at a surface of the semiconductor layer distal to the base, patterning the third metal layer to form a third metal pattern, and enabling the first metal layer to be hollowed out at the alignment mark region; and forming a fourth metal layer at a surface of the third metal layer distal to the semiconductor layer, patterning the fourth metal layer to form a fourth metal pattern, and enabling the fourth metal layer to be hollowed out at the alignment mark region.

In a possible embodiment of the present disclosure, the third metal layer may include, but not limited to, a gate metal layer, and the fourth metal layer may include, but not limited to, a source/drain metal layer.

During the implementation, the alignment mark region may be included in the flat dummy driving circuitry region. Except the alignment mark region, dense lines are provided at the peripheral region adjacent to the alignment mark region, and these lines are nontransparent to visible light. In a certain backlight source condition, these lines may be black in a field of view of the alignment camera. However, no line is arranged at the alignment mark region, and almost all the backlight light may pass through the alignment mark region and enter the alignment camera, i.e., there is a sharp contrast between the alignment mark region and the peripheral region. In this regard, it is able for the alignment camera to identify the alignment mark region.

The present disclosure further provides in some embodiments a display device including the above-mentioned display panel.

In the embodiments of the present disclosure, the display device may be any product or member having a display function, e.g., mobile phone, tablet computer, television, display, notebook computer, digital photo frame or navigator.

Unless otherwise defined, any technical or scientific term used herein shall have the common meaning understood by a person of ordinary skills. Such words as "first" and "second" used in the present disclosure are merely used to differentiate different components rather than to represent any order, number or importance. Similarly, such words as "one" or "one of" are merely used to represent the existence of at least one member, rather than to limit the number thereof. Such words as "comprising" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

In the above description, the features, structures, materials or characteristics may be combined in any one or more embodiments or examples in an appropriate manner.

The above are preferred embodiments of the present disclosure. It should be appreciated that a person skilled in the art may make further modifications and improvements without departing from the principle of the present disclosure, and these modifications and improvements shall also fall within the scope of the present disclosure.

What is claimed is:

1. A display panel, comprising an alignment mark region arranged within a flat region of a peripheral region of the display panel,
   wherein the peripheral region is a region of the display panel other than an active area of the display panel; and
   an alignment mark pattern is arranged within the alignment mark region, and/or at least one film layer within the alignment mark region is hollowed out,
   wherein the display panel comprises an upper surface, a lower surface, a first side surface, a second side surface, a third side surface and a fourth side surface;
   the first side surface, the second side surface, the third side surface and the fourth side surface are curved side surfaces;
   an orthogonal projection of the first side surface onto a first plane does not overlap an orthogonal projection of the flat region onto the first plane;
   an orthogonal projection of the second side surface onto the first plane does not overlap the orthogonal projection of the flat region onto the first plane;
   an orthogonal projection of the third side surface onto the first plane does not overlap the orthogonal projection of the flat region onto the first plane;

an orthogonal projection of the fourth side surface onto the first plane does not overlap the orthogonal projection of the flat region onto the first plane;
the first plane is parallel to the lower surface.

2. The display panel according to claim 1, wherein the film layer comprises a metal layer;
the display panel is provided with a flat surface at the flat region.

3. The display panel according to claim 1, wherein an edge of an orthogonal projection of the alignment mark region onto the base is a polygonal edge, an L-shaped edge or a T-shaped edge, and an orthogonal projection of the alignment mark pattern onto the base is an L-shaped projection, a T-shaped projection, or a polygonal projection.

4. The display panel according to claim 1, wherein the flat region comprises a flat fan-out region; and the alignment mark region is comprised in the flat fan-out region;
within the flat fan-out region, the display panel comprises a first metal layer arranged on a base;
within the alignment mark region, the first metal layer is hollowed out;
within the flat fan-out region, the first metal layer comprises a first metal pattern surrounding the alignment mark region.

5. The display panel according to claim 4, wherein the first metal pattern comprises a connection line between a data line and a source driver; or
the first metal pattern comprises a direct current voltage signal line.

6. The display panel according to claim 4, wherein
within the flat fan-out region, the display panel further comprises a semiconductor layer arranged between the base and the first metal layer;
the semiconductor layer is hollowed out at a region of the flat fan-out region other than the alignment mark region;
within the alignment mark region, the semiconductor layer comprises an alignment mark pattern.

7. The display panel according to claim 4, wherein
within the alignment mark region, the display panel further comprises an anode layer arranged at a surface of the first metal layer distal to the base;
within the alignment mark region, the anode layer is not provided with an opening;
within a region other than the alignment mark region, the anode layer is provided with a plurality of openings arranged at intervals.

8. The display panel according to claim 1, wherein the flat region comprises a flat signal line region, the alignment mark region is comprised in the flat signal line region;
within the alignment mark region, the display panel comprises a semiconductor layer arranged on the base;
the semiconductor layer comprises the alignment mark pattern.

9. The display panel according to claim 1, wherein the flat region comprises a flat signal line region, the alignment mark region is comprised in the flat signal line region;
within the flat signal line region, the display panel comprises a second metal layer arranged on the base;
the second metal layer is hollowed out at the alignment mark region.

10. The display panel according to claim 9, wherein the second metal layer comprises a signal line.

11. A display device, comprising the display panel according to claim 1.

12. A method for manufacturing a display panel, comprising: providing an alignment mark region within a flat region of a peripheral region of the display panel,
wherein an alignment mark pattern is arranged within the alignment mark region, and/or at least one film layer within the alignment mark region is hollowed out;
the peripheral region is a region of the display panel other than an active area of the display panel,
wherein the display panel comprises an upper surface, a lower surface, a first side surface, a second side surface, a third side surface and a fourth side surface;
the first side surface, the second side surface, the third side surface and the fourth side surface are curved side surfaces;
an orthogonal projection of the first side surface onto a first plane does not overlap an orthogonal projection of the flat region onto the first plane;
an orthogonal projection of the second side surface onto the first plane does not overlap the orthogonal projection of the flat region onto the first plane;
an orthogonal projection of the third side surface onto the first plane does not overlap the orthogonal projection of the flat region onto the first plane;
an orthogonal projection of the fourth side surface onto the first plane does not overlap the orthogonal projection of the flat region onto the first plane;
the first plane is parallel to the lower surface.

13. The method according to claim 12, wherein the film layer comprises a metal layer;
the display panel is provided with a flat surface at the flat region.

14. The method according to claim 12, wherein the flat region comprises a flat fan-out region, and the alignment mark region is comprised in the flat fan-out region;
the providing the alignment mark region within the flat region of the peripheral region of the display panel comprises: within the flat fan-out region,
forming a first metal layer on a surface of the base; patterning the first metal layer to form a first metal pattern, and enabling the first metal layer at the alignment mark region to be hollowed out,
wherein the first metal pattern surrounds the alignment mark region.

15. The method according to claim 12, wherein the flat region comprises a flat fan-out region, and the alignment mark region is comprised in the flat fan-out region;
the providing the alignment mark region within the flat region of the peripheral region of the display panel comprises: within the flat fan-out region,
forming a semiconductor layer on a base, and patterning the semiconductor layer to enable the semiconductor layer to be hollowed out at a region of the flat fan-out region other than the alignment mark region;
forming a first metal layer at a surface of the semiconductor layer distal to the base, and patterning the first metal layer to form a first metal pattern and enable the first metal layer at the alignment mark region to be hollowed out,
wherein the first metal pattern surrounds the alignment mark region.

16. The method according to claim 12, wherein the flat region comprises a flat signal line region, and the alignment mark region is comprised in the flat signal line region;
the providing the alignment mark region within the flat region of the peripheral region of the display panel comprises: within the flat signal line region, forming a semiconductor layer on the base, and patterning the semiconductor layer to form an alignment mark pattern, wherein the alignment mark pattern is arranged at the alignment mark region.

17. The method according to claim 12, wherein the flat region comprises a flat signal line region, and the alignment mark region is comprised in the flat signal line region;

the providing the alignment mark region within the flat region of the peripheral region of the display panel comprises: within the flat signal line region, forming a second metal layer on a surface of the base, and enabling the second metal layer to be hollowed out at the alignment mark region.

18. The method according to claim 17, further comprising: patterning the second metal layer to form a signal line.

* * * * *